United States Patent
Chang et al.

(10) Patent No.: US 12,205,941 B2
(45) Date of Patent: Jan. 21, 2025

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Kuang-Ching Chang, Hsinchu (TW); Jung-Chan Yang, Hsinchu (TW); Hui-Zhong Zhuang, Hsinchu (TW); Chih-Liang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 446 days.

(21) Appl. No.: 17/727,338

(22) Filed: Apr. 22, 2022

(65) Prior Publication Data
US 2023/0022333 A1    Jan. 26, 2023

Related U.S. Application Data

(60) Provisional application No. 63/225,118, filed on Jul. 23, 2021.

(51) Int. Cl.
*H01L 27/02* (2006.01)
*H01L 23/522* (2006.01)

(52) U.S. Cl.
CPC ...... *H01L 27/0207* (2013.01); *H01L 23/5226* (2013.01)

(58) Field of Classification Search
CPC .......................... H01L 27/0207; H01L 23/5226
USPC ....................................................... 257/401
See application file for complete search history.

(56) References Cited

U.S. PATENT DOCUMENTS

| 7,260,442 | B2 | 8/2007 | Hwang et al. |
| 8,455,945 | B2* | 6/2013 | Lee ........................ H10B 12/09 |
| | | | 257/E21.429 |
| 9,256,709 | B2 | 2/2016 | Yu et al. |

(Continued)

FOREIGN PATENT DOCUMENTS

| KR | 10-2016-0109974 | 9/2016 |
| KR | 10-2020-0008524 | 1/2020 |

(Continued)

OTHER PUBLICATIONS

Office Action dated May 31, 2023 for corresponding case No. TW 111126913. (pp. 1-4).

*Primary Examiner* — Tu-Tu V Ho
(74) *Attorney, Agent, or Firm* — Hauptman Ham, LLP

(57) ABSTRACT

An integrated circuit includes a set of active regions, a first set of contacts, a set of gates, a first set of power rails and a first set of vias. The set of active regions extends in a first direction. The first set of contacts overlaps the set of active regions, and a first and a second cell boundary of the integrated circuit that extends in a second direction. The set of gates extends in the second direction, overlaps the set of active regions, and is between the first and second cell boundary. The first set of power rails extends in the first direction, and overlaps at least the first set of contacts. The first set of vias electrically couples the first set of contacts and the first set of power rails together. The set of active regions extend continuously through the first cell boundary and the second cell boundary.

20 Claims, 21 Drawing Sheets

(56) References Cited

U.S. PATENT DOCUMENTS

2014/0040838 A1     2/2014   Liu et al.
2015/0278429 A1    10/2015   Chang

FOREIGN PATENT DOCUMENTS

TW         202127296      7/2021
TW         202127297      7/2021

\* cited by examiner

INTEGRATED CIRCUIT AND METHOD OF FORMING THE SAME

PRIORITY CLAIM

This application claims the benefit of U.S. Provisional Application No. 63/225,118, filed Jul. 23, 2021, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
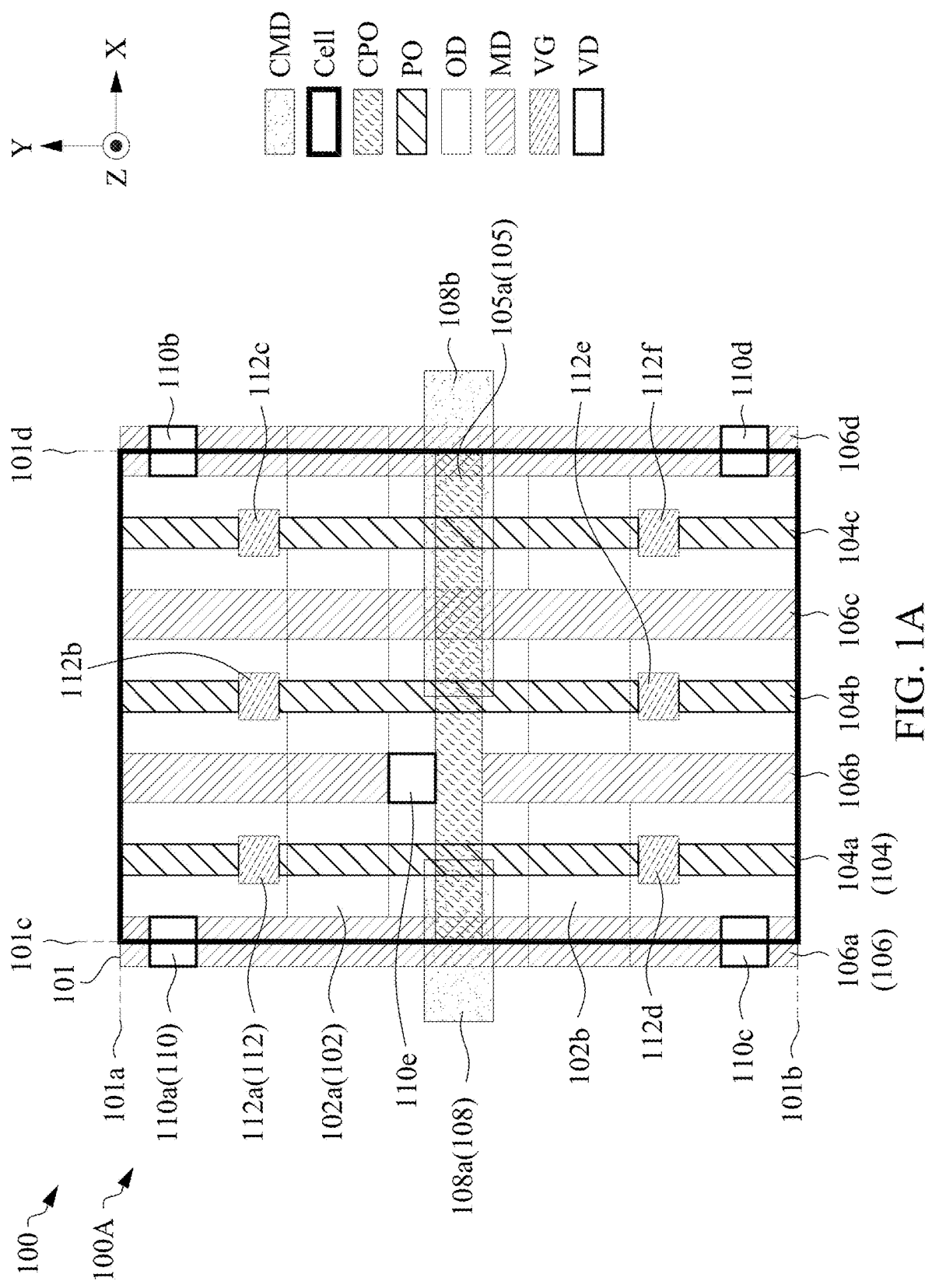
FIGS. 1A-1D are diagrams of a layout design of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a set of active regions, a first set of contacts, a set of gates, a first set of power rails and a first set of vias.

In some embodiments, the set of active regions extends in a first direction, and is on a first level of a substrate.

In some embodiments, the first set of contacts extends in a second direction different from the first direction, and is on a second level different from the first level. In some embodiments, the first set of contacts overlaps the set of active regions. In some embodiments, the first set of contacts further overlaps a first cell boundary and a second cell boundary of the integrated circuit that extends in the second direction.

In some embodiments, the set of gates extends in the second direction and is on a third level different from the first level. In some embodiments, the set of gates overlaps the set of active regions, and is between the first cell boundary and the second cell boundary.

In some embodiments, the first set of power rails extends in the first direction, and is configured to supply a first supply voltage or a second supply voltage. In some embodiments, the first set of power rails is on a fourth level different from the first level, the second level and the third level. In some embodiments, the first set of power rails overlaps at least the first set of contacts.

In some embodiments, the first set of vias is between the first set of contacts and the first set of power rails. In some embodiments, the first set of vias electrically couples together the first set of contacts and the first set of power rails.

In some embodiments, the set of active regions extends continuously through the first cell boundary and the second cell boundary. In some embodiments, by the set of active regions extending continuously through the first cell boundary and the second cell boundary of the integrated circuit, the compressive strain of the set of active regions of the integrated circuit is increased compared to other approaches. By increasing the compressive strain of the set of active regions of the integrated circuit, the driving current capability of the integrated circuit is increased, and the integrated circuit has better performance than other approaches.

FIGS. 1A-1D are diagrams of a layout design 100 of an integrated circuit, in accordance with some embodiments. Layout design 100 is a layout diagram of an integrated circuit 200 of FIGS. 2A-2H.

Figure 1B:
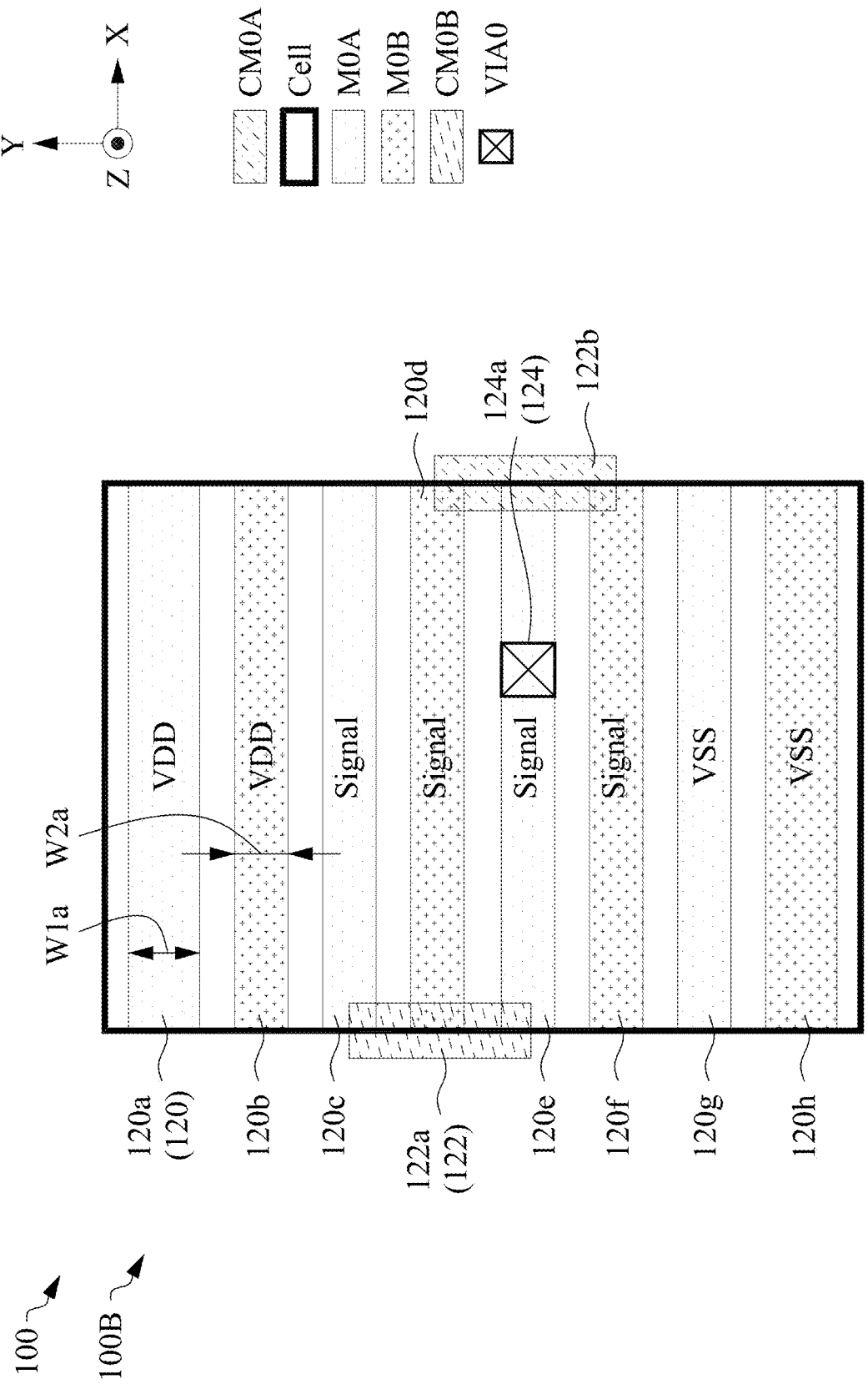
Figure 1C:
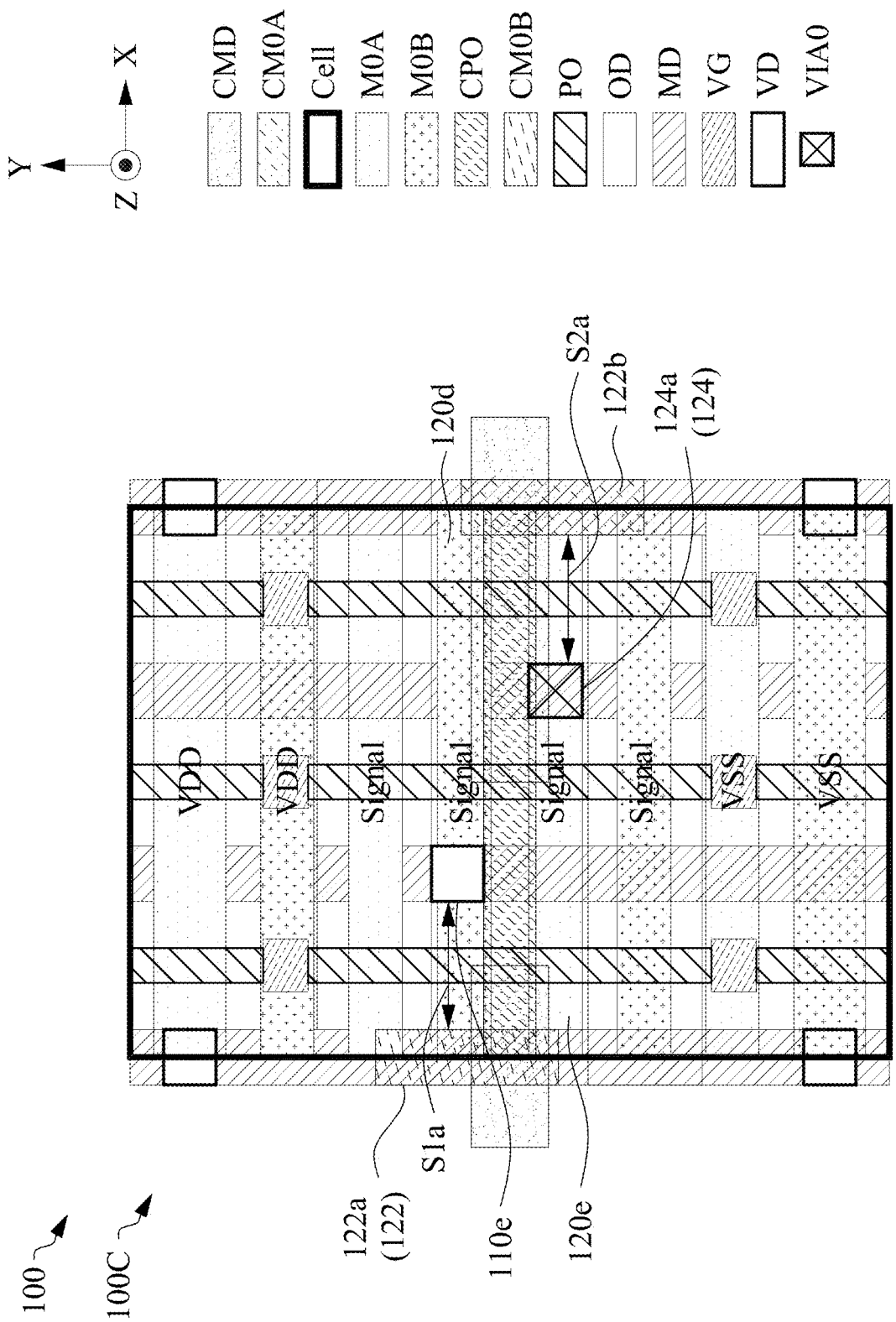
Figure 1D:
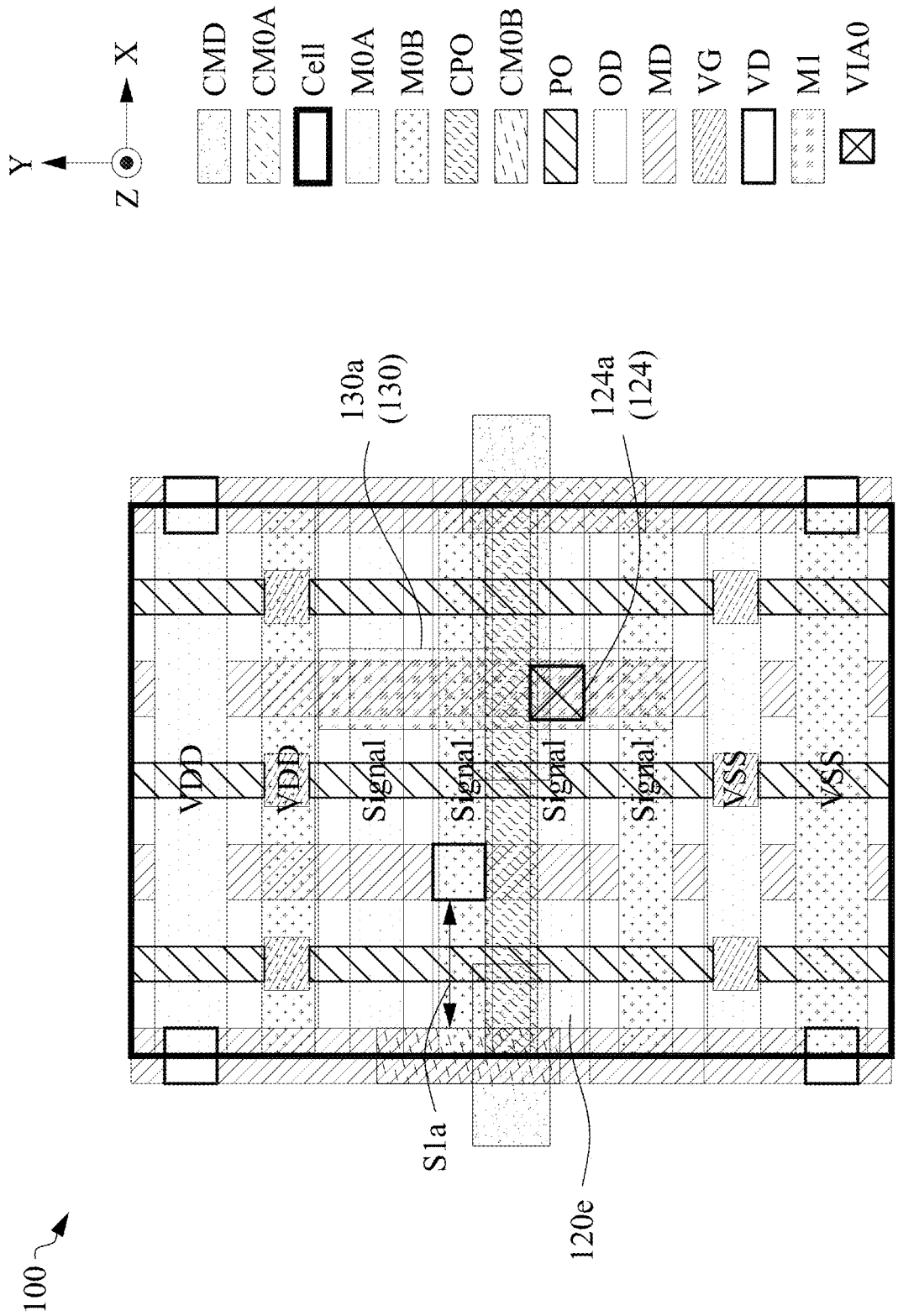

FIG. 1A is a diagram of a corresponding portion 100A of layout design 100 of FIG. 1D simplified for ease of illustration. FIG. 1B is a diagram of a corresponding portion 100B of layout design 100 of FIG. 1D simplified for ease of illustration. FIG. 1C is a diagram of layout design 100 and includes portion 100C simplified for ease of illustration. FIG. 1D is a diagram of layout design 100 and includes portions 100A, 100B and 100C simplified for ease of illustration.

For ease of illustration, some of the labeled elements of one or more of FIGS. 1A-1D, 2A-2H and 3-9 are not labelled in one or more of FIGS. 1A-1D, 2A-2H and 3-9. In some embodiments, layout design 100 includes additional elements not shown in FIGS. 1A-1D.

Portion 100A includes one or more features of layout design 100 of an oxide diffusion (OD) level or an active level, a gate (POLY) level, a cut POLY (CPO) level, a metal over diffusion (MD) level, a cut MD (CMD) level, a via over gate (VG) level and a via over diffusion (VD) level of layout design 100. Portion 100B includes one or more features of layout design 100 of the metal 0 (M0) level, a cut M0 (CM0) level and a via 0 (V0) level. Portion 100C corresponds to a combination of portion 100A and 100B. Portion 100C includes one or more features of layout design 100 of the OD level, the POLY level, the CPO level, the MD level, the CMD level, the VG level, the VD level, the M0 level, the cut M0 (CM0) level and the V0 level.

Layout design 100 includes one or more features of the OD level, the POLY level, the CPO level, the MD level, the CMD level, the VG level, the VD level, the M0 level, the CM0 level, the V0 level, and the metal 1 (M1) level.

Layout design 100 is usable to manufacture integrated circuit 200 of FIGS. 2A-2H.

Layout design 100 includes a cell 101. The cell 101 has cell boundaries 101a and 101b that extend in a first direction X, and cell boundaries 101c and 101d that extend in a second direction Y. In some embodiments, the second direction Y is different from the first direction X. In some embodiments, layout design 100 abuts other cell layout designs (shown in FIG. 3) along cell boundaries 101c and 101d. In some embodiments, layout design 100 abuts other cell layout designs (not shown) along cell boundaries 101a and 101b that extend in the first direction X. In some embodiments, layout design 100 is a single height standard cell.

In some embodiments, cell 101 is a standard cell, and layout design 100 corresponds to a layout of a standard cell defined by cell boundaries 101a, 101b, 101c and 101d. In some embodiments, a cell 101 is a predefined portion of layout design 100 including one or more transistors and electrical connections configured to perform one or more circuit functions. In some embodiments, cell 101 is bounded by cell boundaries 101a, 101b, 101c and 101d, and thus corresponds to a region of functional circuit components or devices that are part of a standard cell.

In some embodiments, e.g., the embodiments depicted in FIGS. 1A-8 discussed below, a given cell has cell boundaries 101c and 101d/201c and 201d that are overlapped by corresponding contact layout patterns 106/contact structures 206 or 406, and are spaced apart by one or more gate patterns/structures. For example, in some embodiments, cell boundaries 101c and 101d of cell 101 are identified by contact layout patterns 106a and 106d. In some embodiments, cell boundaries 101c and 101d of cell 101 are identified by contact layout patterns 106a and 106d that are overlapped by corresponding conductive feature layout patterns 120a and 120h (that correspond to power rail layout patterns).

A cell is thereby configured as one or more of a standard cell, a custom cell, an engineering change order (ECO) cell, a logic gate cell, a memory cell, a physical device cell, or another type of cell or combination of cells capable of being defined in an IC layout diagram, e.g., IC layout design 100. In some embodiments, cell 101 is a standard cell of a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, one or more of layout design 100, 302 or 304 (FIG. 3) is a layout design of a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more of layout design 100, 302 or 304 (FIG. 3) includes layout designs of one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like), FinFETs, nanosheet transistors, nanowire transistors, complementary FETs (CFETs) and planar MOS transistors with raised source/drain. Examples of passive elements include, but are not limited to, capacitors, inductors, fuses, and resistors. In some embodiments, at least layout design 100, 302 or 304 (FIG. 3) is a standard cell layout design. In some embodiments, one or more of layout design 100, 302 or 304 (FIG. 3) is a layout design of a logic gate cell.

Layout design 100 includes one or more active region layout patterns 102a or 102b (collectively referred to as a "set of active region patterns 102") extending in the first direction X.

Embodiments of the present disclosure use the term "layout pattern" which is hereinafter also referred to as "patterns" in the remainder of the present disclosure for brevity.

Active region patterns 102a, 102b of the set of active region patterns 102 are separated from one another in the second direction Y. The set of active region patterns 102 is usable to manufacture a corresponding set of active regions 202 of integrated circuit 200, 400, 500, 600, 700 or 800 (FIG. 2A-2H, 4, 5, 6, 7 or 8).

In some embodiments, the set of active regions 202 are located on a front-side (not labelled) of integrated circuit 200, 400, 500, 600, 700 or 800. In some embodiments, active region patterns 102a, 102b of the set of active region patterns 102 are usable to manufacture corresponding active regions 202a, 202b of the set of active regions 202 of integrated circuit 200, 400, 500, 600, 700 or 800.

Figure 3:
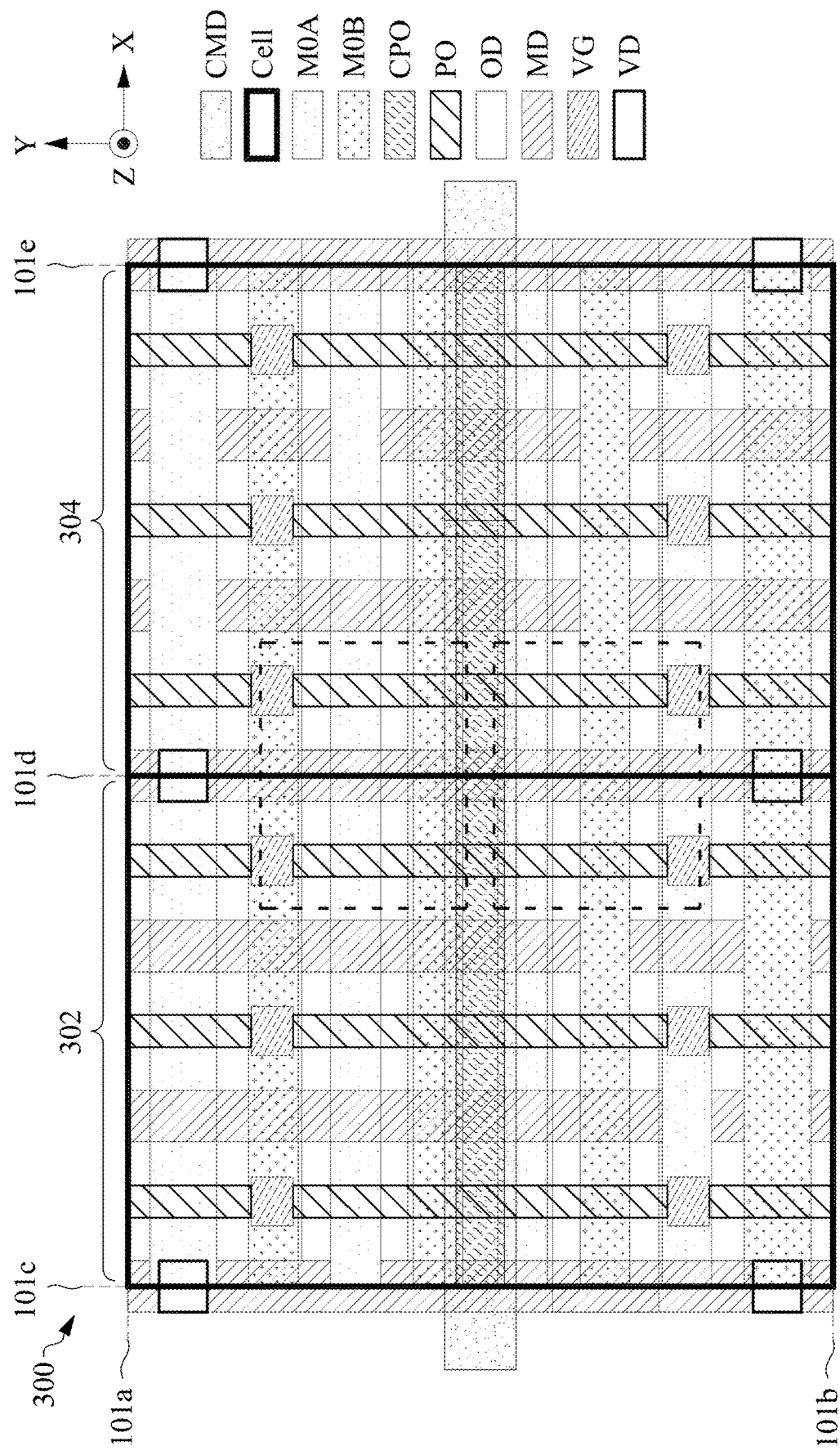
FIG. 3 is a top view of a layout design of an integrated circuit, in accordance with some embodiments.

In some embodiments, the set of active region patterns 102 is referred to as an oxide diffusion (OD) region which defines the source or drain diffusion regions of at least integrated circuit 200, 400, 500, 600, 700 or 800 or layout design 100, 302 or 304 (FIG. 3).

In some embodiments, active region pattern 102a of the set of active region patterns 102 is usable to manufacture source and drain regions of n-type metal oxide semiconductor (NMOS) transistors of integrated circuits 200, 400, 500, 600, 700 or 800, and active region pattern 102b of the set of active region patterns 102 is usable to manufacture source and drain regions of p-type metal oxide semiconductor (PMOS) transistors of integrated circuits 200, 400, 500, 600, 700 or 800.

In some embodiments, active region pattern 102a of the set of active region patterns 102 is usable to manufacture source and drain regions of PMOS transistors of integrated circuits 200, 400, 500, 600, 700 or 800, and active region pattern 102b of the set of active region patterns 102 is usable to manufacture source and drain regions of NMOS transistors of integrated circuits 200, 400, 500, 600, 700 or 800.

In some embodiments, the set of active region patterns 102 is located on a first layout level. In some embodiments, the first layout level corresponds to an active level or an OD level of one or more of layout designs 100 or 300 (FIG. 1A-1D or 3) or integrated circuits 200, 400, 500, 600, 700 or 800.

In some embodiments, active region pattern 102a is usable to manufacture source and drain regions of one or more n-type finFET transistors, n-type nanosheet transistors or n-type nanowire transistors, and active region layout pattern 102b is usable to manufacture source and drain regions of one or more p-type finFET transistors, p-type nanosheet transistors or p-type nanowire transistors.

In some embodiments, active region pattern 102a is usable to manufacture source and drain regions of one or more p-type finFET transistors, p-type nanosheet transistors or p-type nanowire transistors, and active region layout pattern 102b is usable to manufacture source and drain regions of one or more n-type finFET transistors, n-type nanosheet transistors or n-type nanowire transistors.

In some embodiments, the set of active region patterns 102 extends continuously through the cell boundaries 101c or 101d of layout design 100 to other neighboring cells. For example, in the first direction X, the active region pattern 102a or 102b extends beyond cell boundaries 101c or 101d. In some embodiments, by the set of active region patterns 102 extending continuously through the cell boundaries 101c or 101d of layout design 100 to other neighboring cells, the compressive strain of IC structure 200 (e.g., shown in FIGS. 2A-2H) and layout design 100 is increased compared to other approaches. By increasing the compressive strain of IC structure 200 (e.g., shown in FIGS. 2A-2H) and layout design 100, the driving current capability of IC structure 200 and layout design 100 is increased, and IC structure 200 and layout design 100 have better performance than other approaches. In some embodiments, by having an improved compressive strain, IC structure 200 or layout design 100 can have similar driving current capability as other approaches while occupying less area than the other approaches resulting in an overall reduction in physical size of layout design 100 or IC structure 200.

Other widths for the set of active region patterns 102 or other numbers of active region patterns in the set of active region patterns 102 are within the scope of the present disclosure.

Other configurations, arrangements on other layout levels or quantities of patterns in the set of active region patterns 102 are within the scope of the present disclosure.

Layout design 100 further includes one or more gate patterns 104a, 104b or 104c (collectively referred to as a "set of gate patterns 104") extending in the second direction Y. Each of the gate patterns of the set of gate patterns 104 is separated from an adjacent gate pattern of the set of gate patterns 104 in the first direction X by a first pitch (not labelled).

The set of gate patterns 104 is usable to manufacture a corresponding set of gates 204 of integrated circuit 200, 400, 500, 600, 700 or 800 (FIG. 2A-2H, 4, 5, 6, 7 or 8).

In some embodiments, gate patterns 104a, 104b or 104c of the set of gate patterns 104 is usable to manufacture corresponding gates 204a, 204b or 204c of the set of gates 204 of integrated circuit 200, 400, 500, 600, 700 or 800 (FIG. 2A-2H, 4, 5, 6, 7 or 8).

In some embodiments, at least a portion of gate pattern 104a, 104b or 104c of the set of gate patterns 104 is usable to manufacture gates of NMOS transistors of integrated circuit 200, 400, 500, 600, 700 or 800, and at least a portion of gate pattern 104a, 104b or 104c of the set of gate patterns 104 is usable to manufacture gates of PMOS transistors of integrated circuit 200, 400, 500, 600, 700 or 800.

The set of gate patterns 104 is above the set of active region patterns 102. The set of gate patterns 104 is positioned on a second layout level different from the first layout level. In some embodiments, the second layout level is different from the first layout level. In some embodiments, the second layout level corresponds to the POLY level of one or more of layout designs 100 or 300 (FIG. 1A-1D or 3) or integrated circuits 200, 400, 500, 600, 700 or 800.

In some embodiments, the POLY level is above the OD level.

Other configurations, arrangements on other layout levels or quantities of patterns in the set of gate patterns 104 are within the scope of the present disclosure.

Layout design 100 further includes a set of poly cut feature patterns 105. The set of cut feature patterns 105 includes at least a poly cut feature pattern 105a. Set of poly cut feature patterns 105 extends in the first direction X. Poly cut feature pattern 105b overlaps set of gate patterns 104. In some embodiments, poly cut feature pattern 105b overlaps set of gate patterns 104 in a middle portion of layout design 100.

Poly cut feature pattern 105a overlaps set of gate patterns 104 along cell boundary 101c or 101d of layout design 100. In some embodiments, each cut feature pattern (shown in FIG. 5 as 505a or 505b) of the set of poly cut feature patterns 105 is separated from another cut feature pattern (505a or 505b) of the set of poly cut feature patterns 105 in the second direction Y. In some embodiments, the set of poly cut feature patterns 105 extends continuously through the cell boundaries 101a or 101b of layout design 100 to other neighboring cells.

Figure 10:
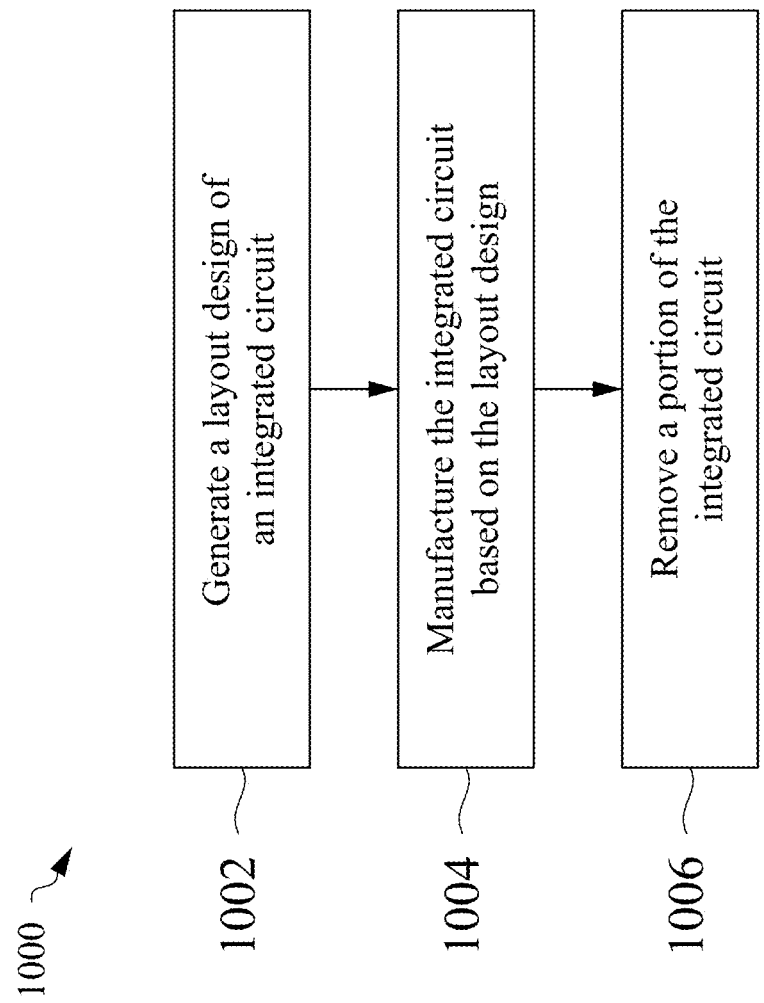
FIG. 10 is a flow chart of a method of manufacturing an IC device, in accordance with some embodiments.

Set of poly cut feature patterns 105 has a gate pattern width (not labelled) in the second direction Y, and a gate pattern length (not labelled) in the first direction X. In some embodiments, poly cut feature pattern 105a are usable to identify a corresponding location of a removed portion of corresponding gate structure 205a of integrated circuit 200 that is removed during operation 1006 of method 1000 (FIG. 10).

In some embodiments, the gate pattern width (not labelled) corresponds to the gate cut width (not labelled) of one or more of gate structures 204a1, 204a2, 204b1, 204b2, 204c1 and 204c2. In some embodiments, the gate pattern length (not labelled) corresponds to the gate cut length (not labelled) of one or more of gate structures 204a1, 204a2, 204b1, 204b2, 204c1 and 204c2. In some embodiments, at least one of the set of gate layout patterns 104, or the set of poly cut feature patterns 105 is located on the second layout level or the POLY level. Other configurations or quantities of patterns in the set of poly cut feature patterns 105 are within the scope of the present disclosure.

Layout design 100 further includes one or more contact patterns 106a, 106b, 106c, 106d (collectively referred to as a "set of contact patterns 106") extending in the second direction Y.

Each of the contact patterns of the set of contact patterns 106 is separated from an adjacent contact pattern of the set of contact patterns 106 in at least the first direction X or the second direction Y.

The set of contact patterns 106 is usable to manufacture a corresponding set of contacts 206 of integrated circuit 200, 400, 500, 600, 700 or 800. In some embodiments, contact pattern 106a, 106b, 106c, 106d of the set of contact patterns 106 is usable to manufacture corresponding contact 206a, 206b, 206c, 206d of the set of contact patterns 206. In some embodiments, the set of contact patterns 106 is also referred to as a set of metal over diffusion (MD) patterns.

In some embodiments, at least one of contact pattern 106a, 106b, 106c, 106d of the set of contact patterns 106 is usable to manufacture source or drain terminals of one of the NMOS or PMOS transistors of integrated circuit 100, 200, 400, 500, 600, 700 or 800.

In some embodiments, at least two contact patterns of the set of contact patterns 106 overlap cell boundaries 101c and 101d. In some embodiments, contact patterns 106a and 106d of the set of contact patterns 106 overlap corresponding cell boundaries 101c and 101d. In some embodiments, a midpoint of corresponding contact patterns 106a and 106d of the set of contact patterns 106 are aligned with corresponding cell boundaries 101c and 101d. In some embodiments, by contact patterns 106a and 106d overlapping corresponding cell boundaries 101c and 101d, the set of gate layout patterns 104 do not overlap cell boundaries 101c and 101d.

In some embodiments, cell boundaries 101c and 101d of cell 101 are identified by contact layout patterns 106a and 106d that are overlapped by set of via layout patterns 110 and a corresponding conductive feature layout patterns 120a and 120h that correspond to power rail layout patterns. In some embodiments, cell boundaries 101c and 101d are identified by one or more layout patterns in the metal over diffusion (MD) layer of layout design 100. In some embodiments, the cell boundaries 101c and 101d are not overlapped by one or more gate layout patterns.

In some embodiments, the set of contact patterns 106 overlap the set of active region patterns 102. The set of contact patterns is located on a third layout level. In some embodiments, the third layout level corresponds to the contact level or an MD level of one or more of layout design 100 or 300, or integrated circuit 100, 200, 400, 500, 600, 700 or 800. In some embodiments, the third layout level is the same as the second layout level. In some embodiments, the third layout level is different from the first layout level.

Other configurations, arrangements on other layout levels or quantities of patterns in the set of contact patterns 106 are within the scope of the present disclosure.

Layout design 100 further includes a set of cut feature patterns 108.

The set of cut feature patterns 108 extends in the first direction X. The set of cut feature patterns 108 includes at least cut feature layout pattern 108a or 108b. In some embodiments, each cut feature layout pattern 108a or 108b of the set of cut feature patterns 108 is separated from an adjacent cut feature layout pattern in the second direction Y. The set of cut feature patterns 108 is located on the third layout level.

In some embodiments, the set of cut feature patterns 108 overlaps at least a portion of a pattern of the set of contact patterns 106. In some embodiments, the set of cut feature patterns 108 overlaps other underlying layout patterns (not shown) of other layout levels (e.g., Active, MD, POLY or the like) of layout design 100.

In some embodiments, cut feature patterns 108a or 108b identify corresponding locations of corresponding portions of contacts 206a, 206b, 206c and 206d that are removed in operation 1006 of method 1000 (FIG. 10).

In some embodiments, cut feature pattern 108a identifies corresponding locations of corresponding portions of corresponding contact 206a that are removed in operation 1006 of method 1000 (FIG. 10). In some embodiments, cut feature pattern 108b identifies corresponding locations of corresponding portions of corresponding contact 206c and 206d that are removed in operation 1006 of method 1000 (FIG. 10).

Cut feature pattern 108a is separated from corresponding cut feature pattern 108b in the first direction X. Cut feature pattern 108a overlaps contact pattern 106a. Cut feature pattern 108b overlaps contact patterns 106c and 106d.

Cut feature patterns 108a and 108b is shown in FIG. 1A as including multiple portions separated from each other in the first direction X. In some embodiments, cut feature patterns 108a and 108b are combined and are part of a single pattern. In some embodiments, one or more of 108a or 108b include multiple portions separated from each other in the first direction X.

Other locations, configurations or quantities of patterns in the set of cut feature patterns 108 are within the scope of the present disclosure.

Layout design 100 further includes one or more conductive feature patterns 120a, 120b, . . . , 120g or 120h (collectively referred to as a "set of conductive feature patterns 120") extending in at least the first direction X.

Each of conductive feature patterns 120a, 120b, . . . , 120g or 120h of the set of conductive feature patterns 120 are separated from each other in at least the second direction Y.

In some embodiments, while each of conductive feature patterns 120a, 120b, . . . , 120g or 120h is shown as continuous patterns, one or more of conductive feature patterns 120a, 120b, . . . , 120g is separated to form discontinuous patterns.

The set of conductive feature patterns 120 is usable to manufacture a corresponding set of conductors 220 of integrated circuit 100, 200, 400, 500, 600, 700 or 800. In some embodiments, conductive feature pattern 120a, 120b, . . . , 120g or 120h is usable to manufacture corresponding conductor 220a, 220b, . . . , 220g or 220h of the set of conductors 220 of integrated circuit 100, 200, 400, 500, 600, 700 or 800. In some embodiments, the set of conductors 220 are located on the front-side (not labelled) of integrated circuit 200.

In some embodiments, conductive feature patterns 120a, 120b, 120g and 120h are referred to as "power rail patterns." In some embodiments, conductive feature pattern 120c, 120d, 120e and 120f are referred to as "signal line patterns." In some embodiments, conductors 220a, 220b, 220g and 220h are referred to as "power rails." In some embodiments, conductors 220c, 220d, 220e and 220f are referred to as "signal lines."

The set of conductive feature patterns 120 overlap the set of gate patterns 104, the set of active region patterns 102 and the set of contact patterns 106. In some embodiments, the set of conductive feature patterns 120 is on a fourth layout level. In some embodiments, the fourth layout level is different from the first layout level, the second layout level and the third layout level. In some embodiments, the fourth layout level corresponds to the M0 level of one or more of layout design 100 or 300, or integrated circuit 100, 200, 400, 500, 600, 700 or 800. In some embodiments, the M0 level is above the OD level, the POLY level, the MD level, the VG level and the VD level.

Each conductive feature pattern in the set of conductive feature patterns 120 is separated from an adjacent conductive feature pattern in the set of conductive feature patterns 120 in the second direction Y by a M0 pitch (not labelled).

As shown in FIG. 1B, in some embodiments, the set of conductive feature patterns 120 have a color A or B. The color A or B indicates that conductive feature patterns 120 with a same color are to be formed or cut (described below with respect to set of cut feature patterns 128) on a same mask of a multiple mask set, and conductive feature patterns 120 with a different color B are to be formed or cut on a different mask of the multiple mask set. Two colors A and B are depicted in FIG. 1B as an example. In some embodiments, there are more or less than two colors in layout design 100.

At least conductive feature pattern 120*a* or 120*h* has a width W1*a* in the second direction Y. At least conductive feature patterns 120*b*, 120*c*, 120*d*, 120*e*, 120*f* or 120*g* have a width W2*a* in the second direction Y. In some embodiments, width W1*a* is greater than width W2*a*. Other widths for the set of conductive feature patterns 120 are within the scope of the present disclosure.

In some embodiments, the set of conductive feature patterns 120 corresponds to 4-6 M0 routing tracks in layout design 100. Other numbers of M0 routing tracks are within the scope of the present disclosure.

Other configurations, arrangements on other layout levels or quantities of patterns in the set of conductive feature patterns 120 are within the scope of the present disclosure.

Layout design 100 further includes one or more via patterns 110*a*, 110*b*, 110*c*, 110*d* (collectively referred to as a "set of via patterns 110").

The set of via patterns 110 is usable to manufacture a corresponding set of vias 210 of integrated circuit 100, 200, 400, 500, 600, 700 or 800. In some embodiments, via patterns 110*a*, 110*b*, 110*c*, 110*d* of the set of via patterns 110 are usable to manufacture corresponding vias 210*a*, 210*b*, 210*c*, 210*d* of the set of vias 210 of integrated circuit 100, 200, 400, 500, 600, 700 or 800.

The set of via patterns 110 is positioned at a via over diffusion (VD) level of one or more of layout design 100 or integrated circuit 100, 200, 400, 500, 600, 700 or 800. In some embodiments, the VD level is above the MD and the OD level. In some embodiments, the VD level is between the MD level and the M0 level. In some embodiments, the VD level is between the third layout level and the fourth layout level. Other layout levels are within the scope of the present disclosure.

In some embodiments, the set of via patterns 110 is located where the set of contact patterns 106 is overlapped by the set of conductors 120. In some embodiments, the set of via patterns 110 is between the set of contact patterns 106 and the set of conductive feature patterns 120. In some embodiments, the size of one or more via patterns in the set of vias patterns 110 can be increased thereby reducing resistance compared to other approaches.

Other configurations, arrangements on other layout levels or quantities of patterns in at least set of via patterns 110 are within the scope of the present disclosure.

Layout design 100 further includes one or more via patterns 112*a*, 112*b*, 112*c*, 112*d*, 112*e* or 112*f* (collectively referred to as a "set of via patterns 112").

The set of via patterns 112 is usable to manufacture a corresponding set of vias 212 of integrated circuit 100, 200, 400, 500, 600, 700 or 800. In some embodiments, via patterns 112*a*, 112*b*, 112*c*, 112*d*, 112*e* or 112*f* of the set of via patterns 112 are usable to manufacture corresponding vias 212*a*, 212*b*, 212*c*, 212*d*, 212*e* or 212*f* of the set of vias 212 of integrated circuit 100, 200, 400, 500, 600, 700 or 800.

The set of via patterns 112 is positioned at a via over gate (VG) level of one or more of layout design 100 or integrated circuit 100, 200, 400, 500, 600, 700 or 800. In some embodiments, the VG level is between the POLY level and the M0 level. In some embodiments, the VG level is between the second layout level and the fourth layout level. Other layout levels are within the scope of the present disclosure.

In some embodiments, the set of vias 112 is located where the set of gate patterns 108 is overlapped by the set of conductive feature patterns 120. In some embodiments, the set of via patterns 112 is between the set of gate patterns 108 and the set of conductive feature patterns 120. In some embodiments, the size of one or more via patterns in the set of vias patterns 112 can be increased thereby reducing resistance compared to other approaches.

Other configurations, arrangements on other layout levels or quantities of patterns in at least set of via patterns 112 are within the scope of the present disclosure.

Layout design 100 further includes a set of cut feature patterns 122.

The set of cut feature patterns 122 extends in the second direction Y. The set of cut feature patterns 122 includes at least cut feature layout pattern 122*a* or 122*b*. In some embodiments, each cut feature layout pattern 122*a* or 122*b* of the set of cut feature patterns 122 is separated from an adjacent cut feature layout pattern in the first direction X. The set of cut feature patterns 122 is located on the fourth layout level or the M0 level.

In some embodiments, the set of cut feature patterns 122 overlaps at least a portion of a conductive feature pattern of the set of conductive feature patterns 120. In some embodiments, the set of cut feature patterns 122 overlaps other underlying layout patterns of other layout levels (e.g., Active, MD, POLY or the like) of layout design 100.

In some embodiments, cut feature patterns 122*a* or 122*b* identify corresponding locations of corresponding portions of conductive features 220*a*, 220*b*, . . . , 220*h* that are removed in operation 1006 of method 1000 (FIG. 10).

Cut feature pattern 122*a* has color B, and overlaps conductive feature pattern 120*d*. In some embodiments, cut feature pattern 122*a* identifies corresponding locations of corresponding portions of corresponding conductive feature 220*d* that are removed in operation 1006 of method 1000 (FIG. 10).

Cut feature pattern 122*b* has color A, and overlaps conductive feature patterns 120*e*. In some embodiments, cut feature pattern 122*b* identifies corresponding locations of corresponding portions of corresponding conductive feature 220*e* that are removed in operation 1006 of method 1000 (FIG. 10).

Cut feature pattern 122*a* is separated from corresponding cut feature pattern 122*b* in the first direction X. Cut feature patterns 122*a* and 122*b* is shown in FIG. 1A as including multiple portions separated from each other in the first direction X. In some embodiments, cut feature patterns 122*a* and 122*b* are combined and are part of a single pattern. In some embodiments, one or more cut feature patterns of 122a or 122b include multiple portions separated from each other in the first direction X.

Cut feature pattern 122a is separated from contact pattern 106b or via pattern 110e in the first direction by a distance S1a. Cut feature pattern 122b is separated from contact pattern 106c or via pattern 124a in the first direction by a distance S2a.

Other locations, configurations or quantities of patterns in the set of cut feature patterns 122 are within the scope of the present disclosure.

Layout design 100 further includes one or more conductive feature patterns 130a (collectively referred to as a "set of conductive feature patterns 130") extending in the second direction Y, and being located on a fifth layout level.

In some embodiments, the fifth layout level is different from the first layout level, the second layout level, the third layout level and the fourth layout level. In some embodiments, the fifth layout level corresponds to a metal 1 (M1) level of one or more of layout designs 100 or integrated circuits 200, 400, 500, 600, 700 or 800. In some embodiments, the M1 level is above the OD level, the POLY level, the MD level, the VG level, the VD level, and the M0 level.

The set of conductive feature patterns 130 is usable to manufacture a corresponding set of conductive structures 230 (FIGS. 2A-2H) of integrated circuit 200. Conductive feature pattern 130a is usable to manufacture corresponding conductive structure 230a.

While conductive feature pattern 130a is shown as one continuous pattern, in some embodiments, conductive feature pattern 130a is divided into one or more discontinuous patterns.

The set of conductive feature patterns 130 overlaps at least the set of gate patterns 104, the set of active region patterns 102, the set of contact patterns 106 or the set of conductive feature patterns 120. In some embodiments, the set of conductive feature patterns 130 overlaps other underlying patterns (not shown for ease of illustration) of other layout levels of layout design 100.

For ease of illustration, layout design 100 shows one conductive feature pattern 130a in the set of conductive feature patterns 130. Other numbers of M1 routing tracks are within the scope of the present disclosure.

Other configurations, arrangements on other layout levels or quantities of patterns in the set of conductive feature patterns 130 are within the scope of the present disclosure.

Layout design 100 further includes one or more via patterns 124a (collectively referred to as a "set of via patterns 124").

The set of via patterns 124 is usable to manufacture a corresponding set of vias 224 of integrated circuit 100, 200, 400, 500, 600, 700 or 800. In some embodiments, via patterns 124a of the set of via patterns 124 are usable to manufacture corresponding vias 224a of the set of vias 224 of integrated circuit 100, 200, 400, 500, 600, 700 or 800.

The set of via patterns 124 is positioned at a via 0 (V0) level of one or more of layout design 100 or integrated circuit 100, 200, 400, 500, 600, 700 or 800. In some embodiments, the V0 level is above the M0 level. In some embodiments, the V0 level is between the M0 level and the M1 level. In some embodiments, the V0 level is between the fourth layout level and the fifth layout level. Other layout levels are within the scope of the present disclosure.

In some embodiments, the set of via patterns 124 is located where the set of conductive feature patterns 120 is overlapped by the set of conductive feature patterns 130. In some embodiments, the set of via patterns 124 is between the set of conductive feature patterns 120 and the set of conductive feature patterns 130. In some embodiments, the size of one or more via patterns in the set of vias patterns 124 can be increased thereby reducing resistance compared to other approaches.

Other configurations, arrangements on other layout levels or quantities of patterns in at least set of via patterns 124 are within the scope of the present disclosure.

In some embodiments, by contact patterns 106a and 106d overlapping corresponding cell boundaries 101c and 101d, causes corresponding distances S1a and S2a between corresponding via patterns 110e and 124a and corresponding cut feature patterns 122a and 122b to be increased compared to other approaches. In some embodiments, by increasing distance S1a and S2a, the region of the corresponding conductive feature patterns 120d and 120e that overlaps corresponding via patterns 110e and 124a is sufficiently separated from the corresponding cut feature patterns 122a and 122b to not violate design rules, and thereby provides a larger via landing zone for corresponding via patterns 110e and 124a compared to other approaches, resulting in a layout design that occupies less area than other approaches and is useable to manufacture integrated circuits 200, 400, 500, 600, 700 or 800 with better manufacturing yield than other approaches.

Other configurations, arrangements on other layout levels or quantities of elements in layout design 100 are within the scope of the present disclosure.

FIGS. 2A-2H are diagrams of an integrated circuit 200, in accordance with some embodiments.

Figure 2A:
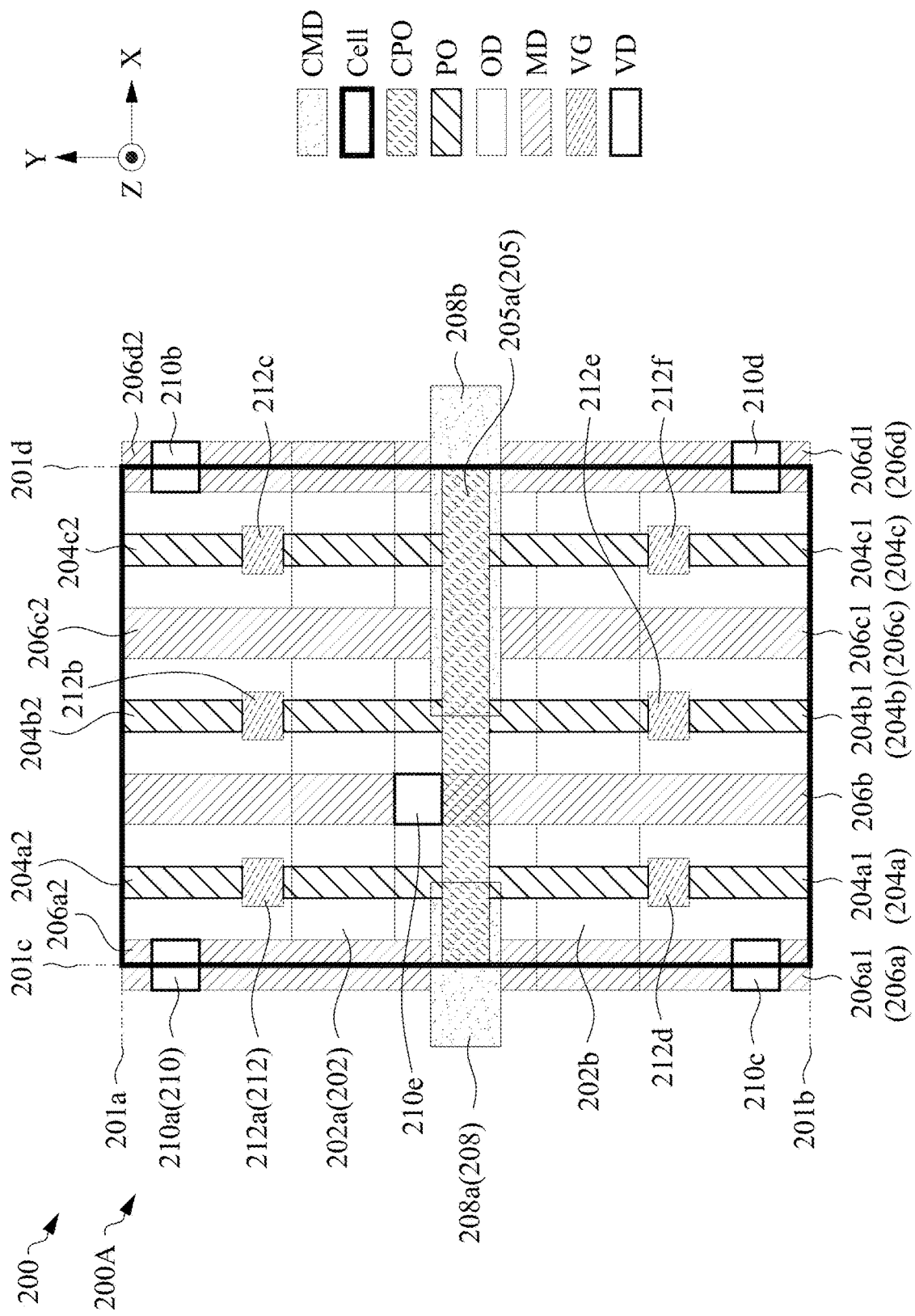
FIGS. 2A-2H are diagrams of an integrated circuit, in accordance with some embodiments.
Figure 2B:
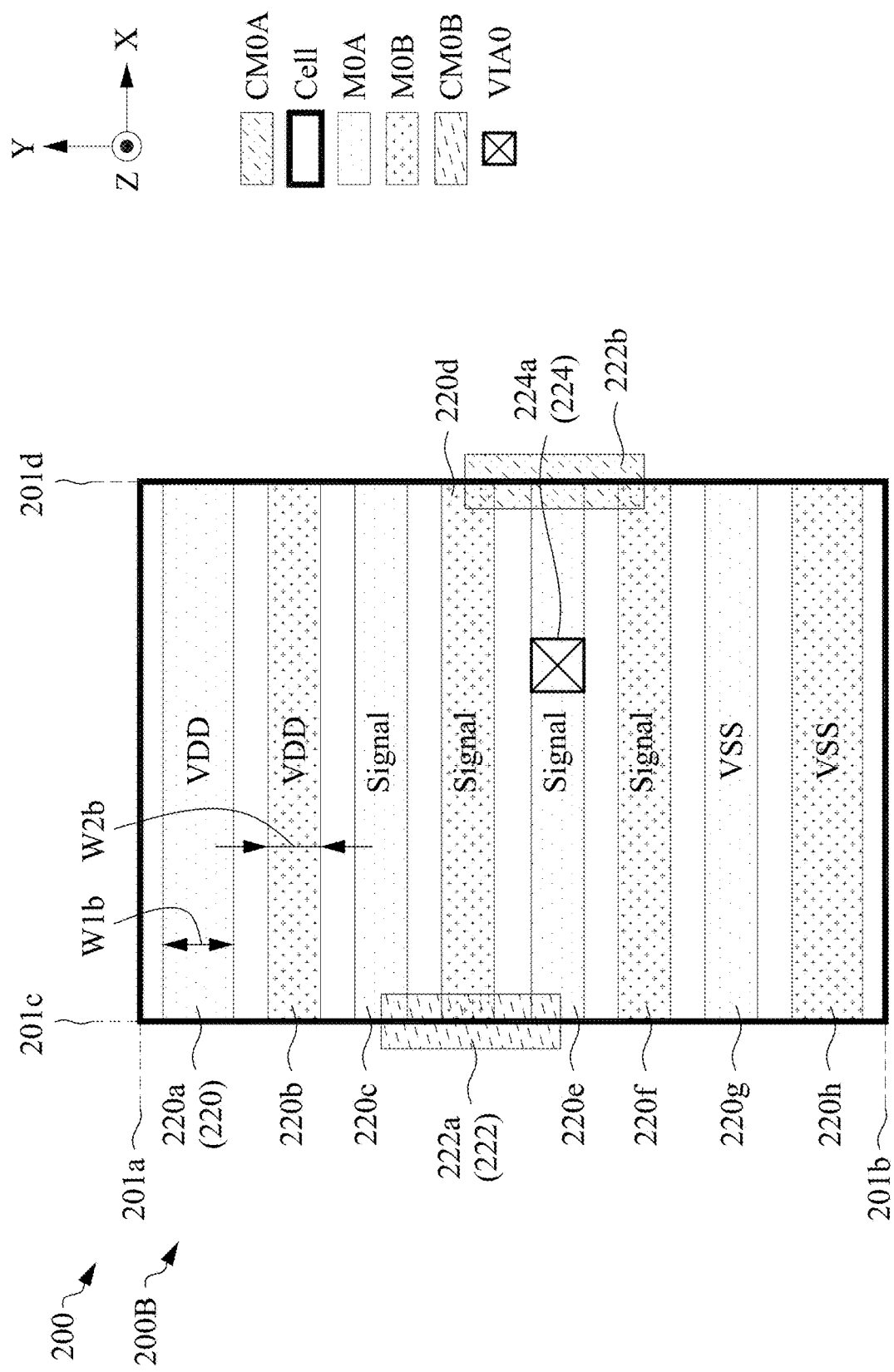
Figure 2C:
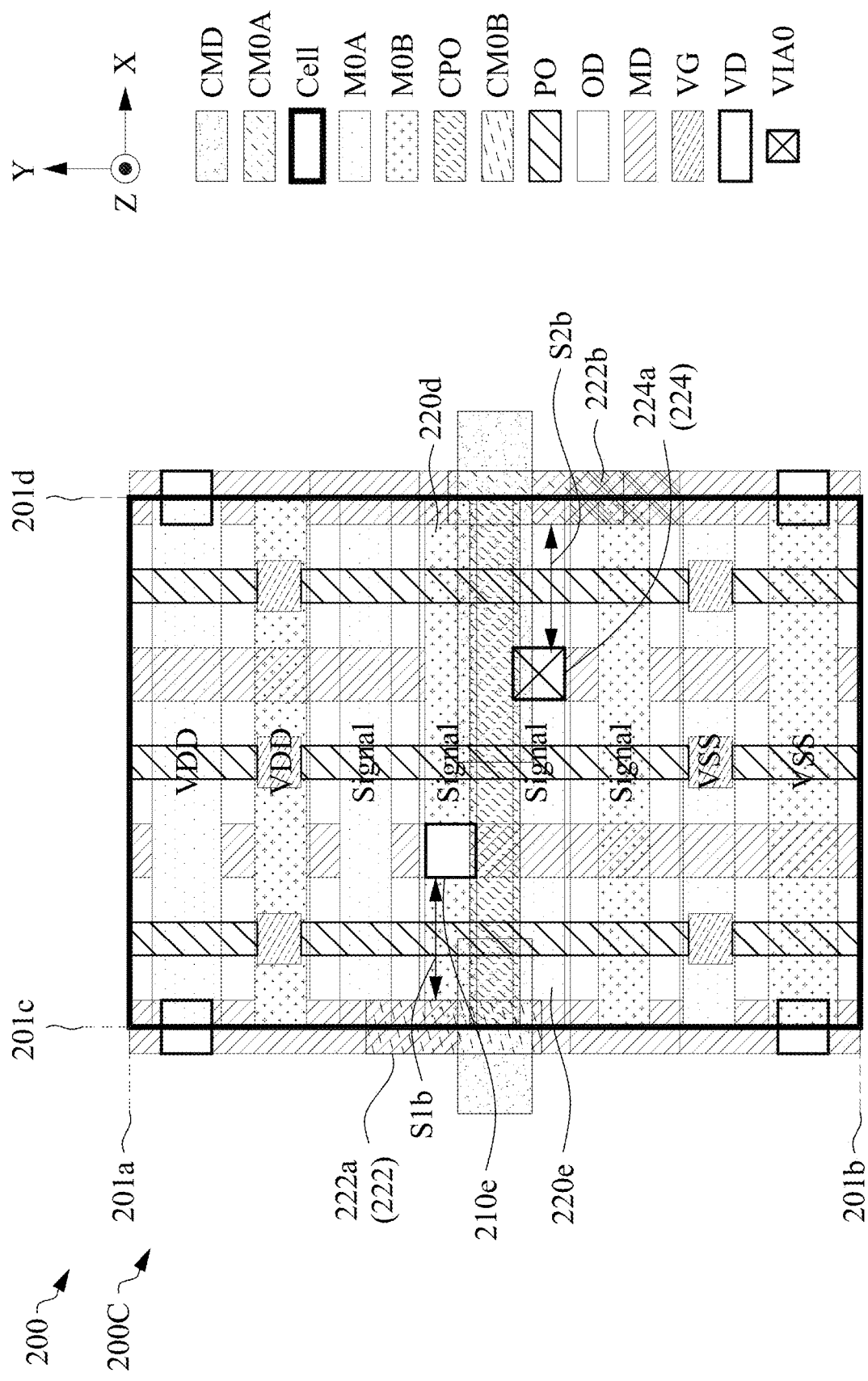
Figure 2D:
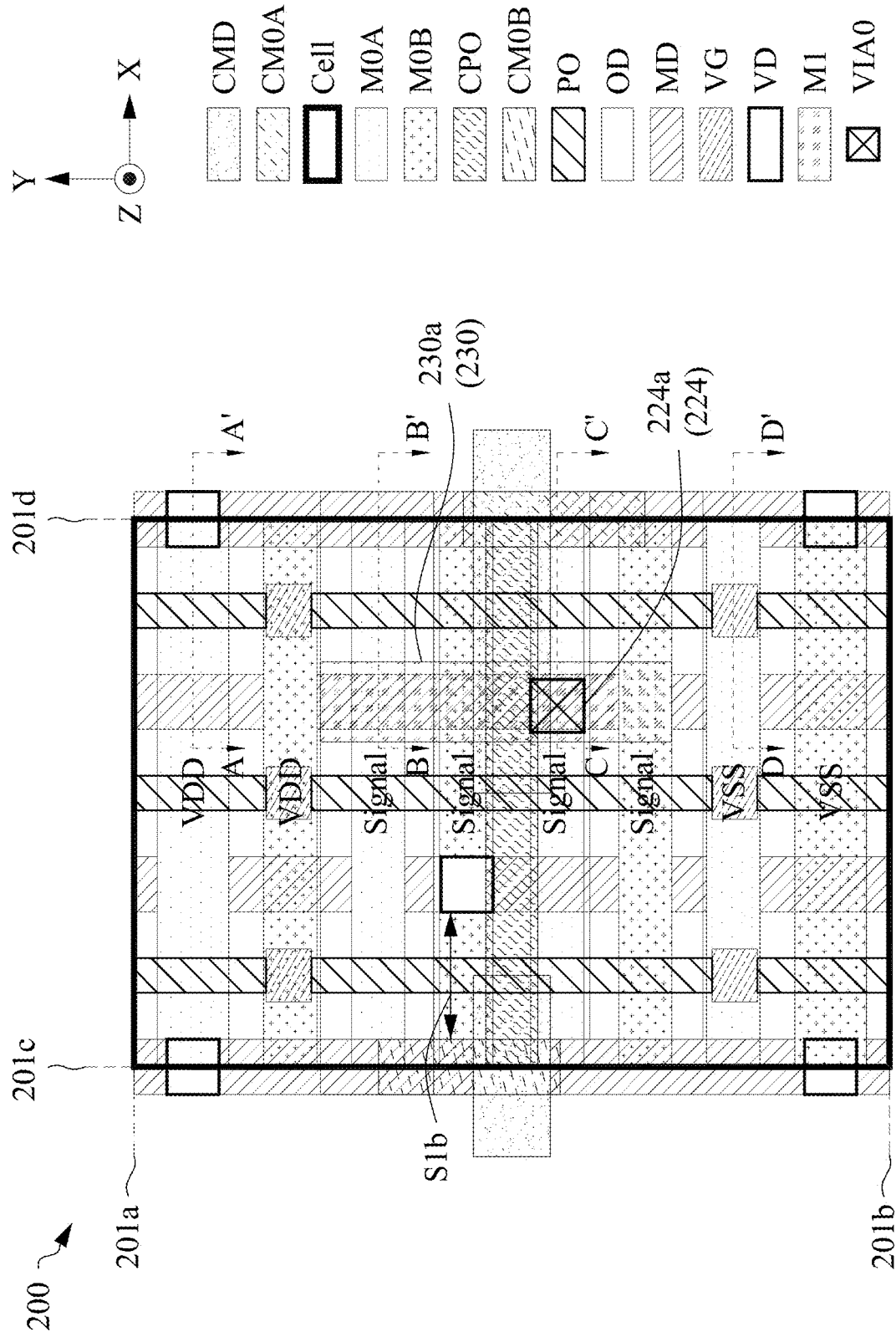

FIG. 2D is a top view of integrated circuit 200, in accordance with some embodiments.

FIG. 2A is a diagram of a corresponding portion 200A of integrated circuit 200 of FIG. 2D, simplified for ease of illustration. FIG. 2B is a diagram of a corresponding portion 200B of integrated circuit 200 of FIG. 2D, simplified for ease of illustration. FIG. 2C is a diagram of a corresponding portion 200C of integrated circuit 200 of FIG. 2D, simplified for ease of illustration. FIG. 2D is a diagram of integrated circuit 200 and includes portions 200A, 200B and 200C, simplified for ease of illustration.

Portion 200A includes one or more features of integrated circuit 200 of the OD level, the POLY level, the CPO level, the MD level, the CMD level, the VG level and the VD level of integrated circuit 200.

Portion 200B includes one or more features of integrated circuit 200 of the M0 level, the CM0 level and the V0 level.

Portion 200C corresponds to a combination of portion 200A and 200B. Portion 200C includes one or more features of integrated circuit 200 of the OD level, the POLY level, the CPO level, the MD level, the CMD level, the VG level, the VD level, the M0 level, the CM0 level and the V0 level. In some embodiments, integrated circuit 200 includes additional elements not shown in FIGS. 2A-2H.

Figure 2F:
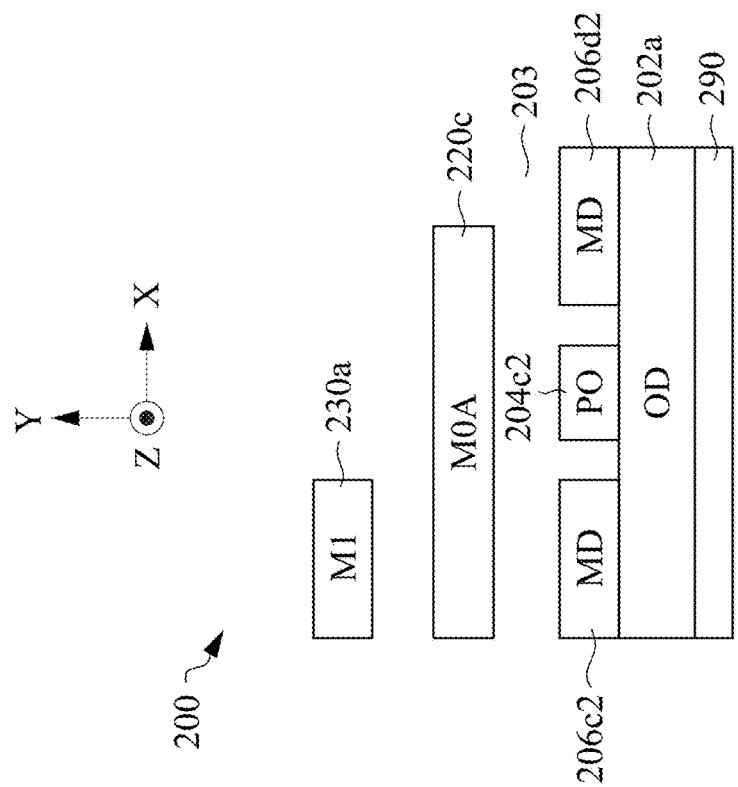
Figure 2E:
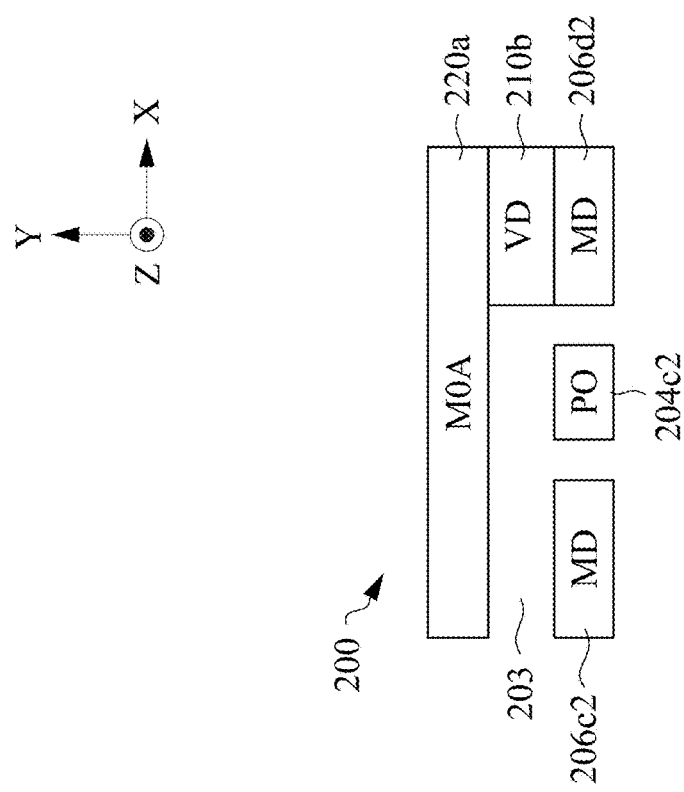
Figure 2H:
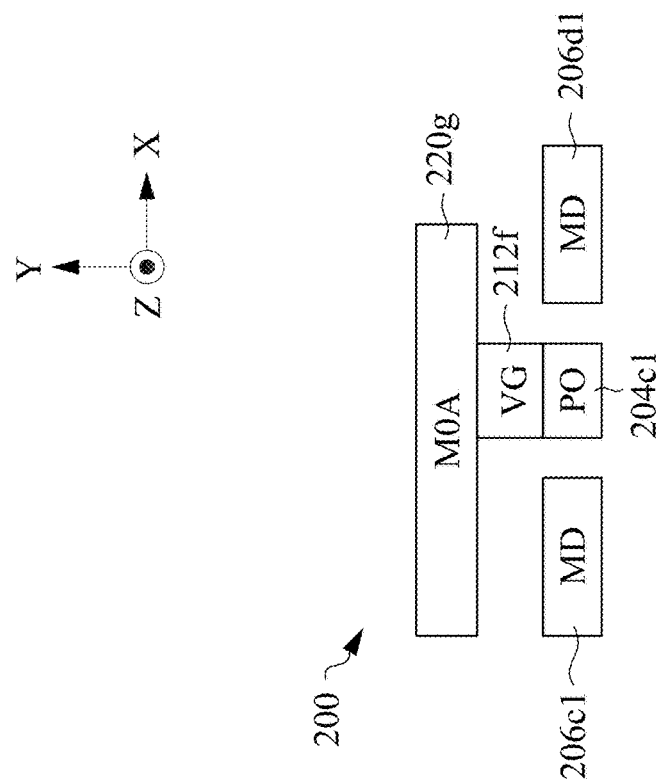
Figure 2G:
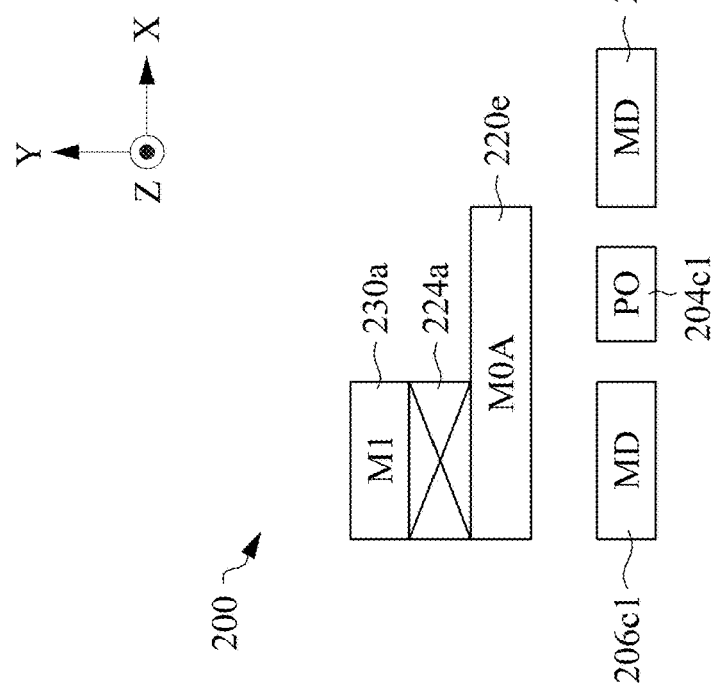

FIGS. 2E-2H are corresponding cross-sectional views of integrated circuit 200, in accordance with some embodiments. FIG. 2E is a cross-sectional view of integrated circuit 200 as intersected by plane A-A', in accordance with some embodiments. FIG. 2F is a cross-sectional view of integrated circuit 200 as intersected by plane B-B', in accordance with some embodiments. FIG. 2G is a cross-sectional view of integrated circuit 200 as intersected by plane A-A', in accordance with some embodiments. FIG. 2H is a cross-sectional view of integrated circuit 200 as intersected by plane B-B', in accordance with some embodiments.

Components that are the same or similar to those in one or more of FIGS. 1A-1D, 2A-2H, 3, and 4-8 (shown below) are given the same reference numbers, and detailed description thereof is thus omitted.

Integrated circuit 200 is manufactured by layout design 100. Structural relationships including alignment, lengths and widths, as well as configurations and layers of integrated circuit 200 are similar to the structural relationships and configurations and layers of layout design 100 of FIGS. 1A-1D, and similar detailed description will not be described in at least FIGS. 2A-2H, for brevity. For example, in some embodiments, at least distance S1a or S2a of layout design 100 is similar to corresponding distance S1b or S2b of integrated circuit 200, and similar detailed description is omitted for brevity.

For example, in some embodiments, at least one or more widths, lengths or pitches of layout design 100 is similar to corresponding widths, lengths or pitches of integrated circuit 200, and similar detailed description is omitted for brevity. For example, in some embodiments, at least cell boundaries 101a, 101b, 101c or 101d or a mid-point (not labelled) of layout design 100 is similar to at least corresponding cell boundaries 201a, 201b, 201c or 201d or a mid-point (not labelled) of integrated circuit 200, and similar detailed description is omitted for brevity.

Integrated circuit 200 includes at least the set of active regions 202, an insulating region 203, the set of gates 204, the set of contacts 206, the set of vias 210, the set of vias 212, the set of conductors 220, the set of vias 224, and the set of conductors 230.

The set of active regions 202 include one or more of active regions 202a or 202b embedded in a substrate 290. Substrate has a front-side (not labelled) and a back-side (not labelled) opposite from the front-side. In some embodiments, at least the set of active regions 202, the set of gates 204, the set of contacts 206, the set of vias 210, the set of vias 212, the set of conductors 220, the set of vias 224, or the set of conductors 230 are formed in the front-side of substrate 290.

In some embodiments, the set of active regions 202 corresponds to nanosheet structures (not labelled) of nanosheet transistors. In some embodiments, the set of active regions 202 include drain regions and source regions grown by an epitaxial growth process. In some embodiments, the set of active regions 202 include drain regions and source regions that are grown with an epitaxial material at the corresponding drain regions and source regions.

Other transistor types are within the scope of the present disclosure. For example, in some embodiments, the set of active regions 202 corresponds to nanowire structures (not shown) of nanowire transistors. In some embodiments, the set of active regions 202 corresponds to planar structures (not shown) of planar transistors. In some embodiments, the set of active regions 202 corresponds to fin structures (not shown) of finFETs. In some embodiments, the set of active regions 202 corresponds to structures (not shown) of complementary FETs (CFETs).

In some embodiments, active region 202a corresponds to source and drain regions of NMOS transistors of integrated circuit 200, 400, 500, 600, 700 or 800, and active region 202b corresponds to source and drain regions of PMOS transistors of integrated circuit 200, 400, 500, 600, 700 or 800.

In some embodiments, active region 202a corresponds to source and drain regions of PMOS transistors of integrated circuit 200, 400, 500, 600, 700 or 800, and active region 202b corresponds to source and drain regions of NMOS transistors of integrated circuit 200, 400, 500, 600, 700 or 800.

In some embodiments, at least active region 202a is an N-type doped S/D region, and active region 202b is a P-type doped S/D region embedded in a dielectric material of substrate 290. In some embodiments, at least active region 202a is a P-type doped S/D region, and active region 202b is an N-type doped S/D region embedded in a dielectric material of substrate 290.

In some embodiments, the set of active regions 202 extends continuously through the cell boundaries 201c or 201d of integrated circuit 200 to other neighboring cells. For example, in the first direction X, the active region 202a or 202b extends beyond cell boundaries 201c or 201d. In some embodiments, by the set of active regions 202 extending continuously through the cell boundaries 201c or 201d of integrated circuit 200 to other neighboring cells, causes an increase in the compressive strain of the set of active regions 202 of integrated circuit 200 compared to other approaches. By increasing the compressive strain of the set of active regions 202 of integrated circuit 200, the driving current capability of integrated circuit 200 is increased, and integrated circuit 200 has better performance than other approaches. In some embodiments, by having an improved compressive strain, integrated circuit 200 can have similar driving current capability as other approaches while occupying less area than the other approaches resulting in an overall reduction in physical size of integrated circuit 200.

Other configurations, arrangements on other layout levels or quantities of structures in the set of active regions 202 are within the scope of the present disclosure.

Figure 9:
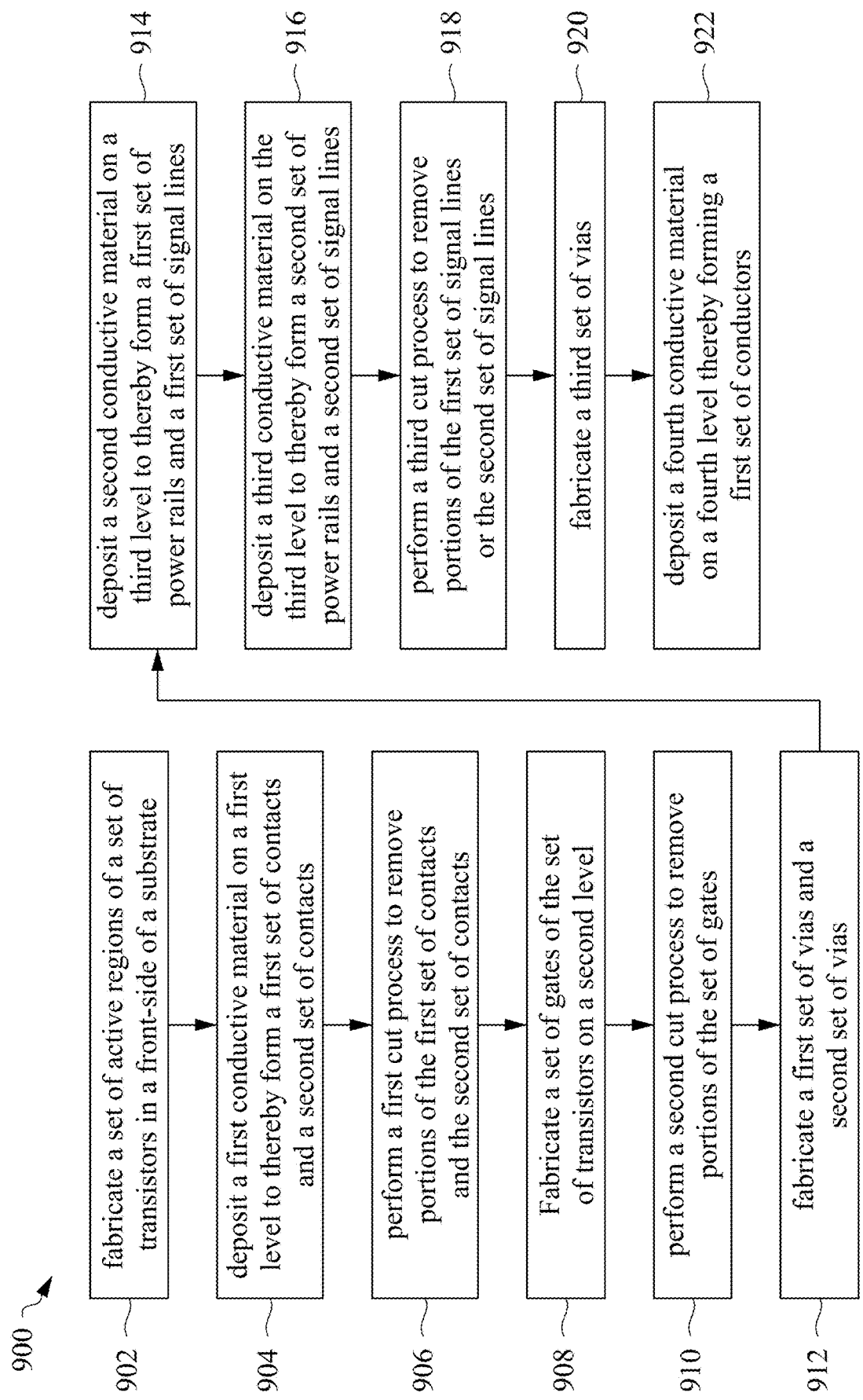
FIG. 9 is a flow chart of a method of forming or manufacturing an integrated circuit in accordance with some embodiments.

Insulating region 203 is configured to electrically isolate one or more elements of the set of active regions 202, the set of gates 204, the set of contacts 206, the set of vias 210, the set of vias 212, the set of conductors 220, the set of vias 224, or the set of conductors 230 from one another. In some embodiments, insulating region 203 includes multiple insulating regions deposited at different times from each other during method 900 (FIG. 9). In some embodiments, insulating region is a dielectric material. In some embodiments, the dielectric material includes silicon dioxide, silicon oxynitride, or the like.

Other configurations, arrangements on other layout levels or other numbers of portions in insulating region 203 are within the scope of the present disclosure.

The set of gates 204 include one or more of gates 204a, 204b or 204c. Gate 204a includes gate 204a1 and gate 204a2. Gate 204b includes gate 204b1 and gate 204b2. Gate 204c includes gate 204c1 and gate 204c2. Gate 204a1, 204b1, 204c1 is separated from corresponding gate 204a2, 204b2, 204c2 by a removed gate portion 205a. In some embodiments, the removed gate portion 205a of a set of removed gate portions 205 is removed during operation 1006 of FIG. 10 (described below).

In some embodiments, at least a portion of gate 204a, 204b or 204c is a gate of NMOS transistors of integrated circuits 200, 400, 500, 600, 700 or 800, and at least a portion of gate 204a, 204b or 204c is a gate of PMOS transistors of integrated circuits 200, 400, 500, 600, 700 or 800. For example, in some embodiments, gate 204a1, 204b1 or 204c1 is a gate of NMOS transistors of integrated circuits 200, 400, 500, 600, 700 or 800, and gate 204a2, 204b2 or 204c2 is a gate of PMOS transistors of integrated circuits 200, 400, 500, 600, 700 or 800. For example, in some embodiments, gate 204a1, 204b1 or 204c1 is a gate of PMOS transistors of integrated circuits 200, 400, 500, 600, 700 or 800, and gate 204a2, 204b2 or 204c2 is a gate of NMOS transistors of integrated circuits 200, 400, 500, 600, 700 or 800.

In some embodiments, at least gate 204a, 204b or 204c corresponds to a dummy gate. In some embodiments, a dummy gate is a gate of a non-functional transistor.

Other configurations, arrangements on other layout levels or quantities of gates in the set of gates 204 are within the scope of the present disclosure.

The set of contacts 206 include one or more of contact 206a, 206b, 206c or 206d. The set of contacts 206 are located on the front-side of integrated circuit 200. The set of contacts 206 overlap the set of active regions 202.

Contact 206a includes contact 206a1 and contact 206a2. Contact 206c includes contact 206c1 and contact 206c2. Contact 206d includes contact 206d1 and contact 206d2. Contact 206a1 is separated from corresponding contact 206a2 by a removed contact portion 208a. Contact 206c1, 206d1 is separated from corresponding contact 206c2, 206d2 by a removed contact portion 208b. In some embodiments, the removed contact portions 208a and 208b of a set of removed contact portions 208 are removed during operation 1006 of FIG. 10 (described below).

Each contact of the set of contacts 206 corresponds to one or more drain or source terminals of PMOS or NMOS transistors of integrated circuit 200.

In some embodiments, at least a portion of contact 206a, 206b, 206c or 206d is a source/drain terminal of NMOS transistors of integrated circuits 200, 400, 500, 600, 700 or 800, and at least a portion of contact 206a, 206b, 206c or 206d is a source/drain terminal of PMOS transistors of integrated circuits 200, 400, 500, 600, 700 or 800. For example, in some embodiments, contact 206a1, 206c1 or 206d1 is a source/drain terminal of NMOS transistors of integrated circuits 200, 400, 500, 600, 700 or 800, and contact 206a2, 206c2 or 206d2 is a source/drain terminal of PMOS transistors of integrated circuits 200, 400, 500, 600, 700 or 800. For example, in some embodiments, contact 206a1, 206c1 or 206d1 is a source/drain terminal of PMOS transistors of integrated circuits 200, 400, 500, 600, 700 or 800, and contact 206a2, 206c2 or 206d2 is a source/drain terminal of NMOS transistors of integrated circuits 200, 400, 500, 600, 700 or 800.

In some embodiments, one or more contacts of the set of contacts 206 overlaps a pair of active regions of the set of active regions 202, thereby electrically coupling the pair of active regions of the set of active regions 202 and the source or drain of the corresponding transistors.

In some embodiments, at least two contacts of the set of contacts 206 overlap cell boundaries 201c and 201d. In some embodiments, contacts 206a and 206d of the set of contacts 206 overlap corresponding cell boundaries 201c and 201d. In some embodiments, a mid-point of corresponding contacts 206a and 206d of the set of contacts 206 are aligned with corresponding cell boundaries 201c and 201d. In some embodiments, by contacts 206a and 206d overlapping corresponding cell boundaries 201c and 201d, the set of gates 204 do not overlap cell boundaries 201c and 201d.

In some embodiments, cell boundaries 201c and 201d are identified by one or more structures in the MD layer of integrated circuit 200. In some embodiments, cell boundaries 201c and 201d of cell 201 are identified by contacts 206a and 206d. In some embodiments, cell boundaries 201c and 201d of cell 201 are identified by contacts 206a and 206d that are overlapped by set of vias 210 and a corresponding conductor 220a and 220h that correspond to power rails. In some embodiments, the cell boundaries 201c and 201d are identified by not being overlapped by one or more gates in the set of gates 204.

Other lengths or widths for the set of contacts 206 are within the scope of the present disclosure. Other configurations, arrangements on other layout levels or quantities of contacts in the set of contacts 206 are within the scope of the present disclosure.

The set of vias 210 include one or more of vias 210a, 210b, 210c or 210d. In some embodiments, the set of vias 210 are between the set of contacts 206 and a set of conductors 220. The set of vias 210 is embedded in insulating region 203.

The set of vias 210 is located where the set of contacts 206 are overlapped by the set of conductors 220. Via 210a or 210b is located where corresponding contact 206a2 or 206d2 is overlapped by conductor 220a. Via 210c or 210d is located where corresponding contact 206a1 or 206d1 is overlapped by conductor 220h.

In some embodiments, at least two vias of the set of vias 210 overlap cell boundaries 201c and 201d. In some embodiments, vias 210a and 210c of the set of vias 210 overlap cell boundary 201c. In some embodiments, vias 210b and 210d of the set of vias 210 overlap cell boundary 201d. In some embodiments, a mid-point of each of vias 210a and 210c are aligned in the second direction Y with cell boundary 201c. In some embodiments, a mid-point of each of vias 210b and 210d are aligned in the second direction Y with cell boundary 201d. In some embodiments, by vias 210a, 210b, 210c and 210d overlapping cell boundaries 201c and 201d, additional routing resources are provided within a region inside of cell boundaries 201a, 201b, 201c and 201d of integrated circuit 200.

The set of vias 210 are configured to electrically couple the set of active regions 202 and the set of conductors 220 together by the set of contacts 206. At least via 210a or 210b is configured to electrically couple active region 202a and conductor 220a together by corresponding contact 206a2 or 206d2. At least via 210c or 210d is configured to electrically couple active region 202b and conductor 220h together by corresponding contact 206a1 or 206d1.

In some embodiments, the set of vias 210 are configured to electrically couple a corresponding source or drain region of the set of active regions 202 to the set of contacts 206.

Other configurations, arrangements on other layout levels or quantities of vias in the set of vias 210 are within the scope of the present disclosure.

The set of vias 212 include one or more of vias 212a, 212b, 212c, 212d, 212e or 212f. In some embodiments, the set of vias 212 are between the set of gates 204 and the set of conductors 220. The set of vias 212 is embedded in insulating region 203.

The set of vias 212 is located where the set of gates 204 are overlapped by the set of conductors 220. Via 212a, 212b or 212c is located where corresponding gate 204a2, 204b2 or 204c2 is overlapped by conductor 220b. Via 212d, 212e or 212f is located where corresponding gate 204a1, 204b1 or 204c1 is overlapped by conductor 220g.

The set of vias 212 are configured to electrically couple the set of gates 204 and the set of conductors 220 together. At least via 212a, 212b or 212c is configured to electrically couple corresponding gate 204a2, 204b2 or 204c2 and conductor 220b together. At least via 212d, 212e or 212f is configured to electrically couple corresponding gate 204a1, 204b1 or 204c1 and conductor 220g together.

In some embodiments, the set of vias 212 are configured to electrically couple a corresponding gate of the set of gates 204 to one or more conductors of the set of conductors 220.

Other configurations, arrangements on other layout levels or quantities of vias in the set of vias 212 are within the scope of the present disclosure.

The set of conductors 220 include one or more of conductors 220a, 220b, 220c, . . . , 220g or 220h. In some embodiments, the set of conductors 220 corresponds to a set of conductive structures. The set of conductors 220 is embedded in insulating region 203.

At least conductor 220a or 220h has a width W1b in the second direction Y. At least conductor 220b, 220c, 220d, 220e, 220f or 220g has a width W2b in the second direction Y. In some embodiments, width W1b is greater than width W2b. Other widths for the set of conductors 220 are within the scope of the present disclosure.

The set of conductors 220 overlap the set of contacts 206 and the set of gates 204. Conductors 220c and 220f overlap corresponding active regions 202a and 202b.

In some embodiments, at least conductor 220a, 220b, 220g or 220h of the set of conductors 220 is configured to provide power to the set of active regions 202 or the set of gates 204, and thus conductors 220a, 220b, 220g and 220h are referred to as "power rails." In some embodiments, the set of conductors 220 is configured to provide a first supply voltage of a voltage supply VDD or a second supply voltage of a reference voltage supply VSS to the integrated circuit, such as integrated circuit 200. In some embodiments, the first supply voltage is different from the second supply voltage.

In some embodiments, conductor 220a is configured to provide the first supply voltage of voltage supply VDD to the sources/drains of active region 202a by vias 210a, 210b and corresponding contacts 206a2, 206d2, and conductor 220h is configured to provide the second supply voltage of reference voltage supply VSS to the sources/drains of active region 202b by vias 210c, 210d and corresponding contacts 206a1, 206d1.

In some embodiments, conductor 220b is configured to provide the first supply voltage of voltage supply VDD to gates 204a2, 204b2 and 204c2 by corresponding vias 212a, 212b, 212c, and conductor 220g is configured to provide the second supply voltage of reference voltage supply VSS to gates 204a1, 204b1 and 204c1 by corresponding vias 212d, 212e, 212f.

In some embodiments, active region 202a corresponds to PMOS transistors and active region 202b corresponds to NMOS transistors, and conductor 220b is configured to provide the first supply voltage of voltage supply VDD to gates 204a2, 204b2 and 204c2 by corresponding vias 212a, 212b, 212c thereby turning off the PMOS transistors in active region 202a, and conductor 220g is configured to provide the second supply voltage of reference voltage supply VSS to gates 204a1, 204b1 and 204c1 by corresponding vias 212d, 212e, 212f thereby turning off the NMOS transistors in active region 202b. In some embodiments, the turned off PMOS/NMOS transistors also are referred to as corresponding tie-high/tie-low cells.

In some embodiments, active region 202a corresponds to NMOS transistors and active region 202b corresponds to PMOS transistors, and conductor 220b is configured to provide the first supply voltage of voltage supply VDD to gates 204a2, 204b2 and 204c2 by corresponding vias 212a, 212b, 212c thereby turning on the NMOS transistors in active region 202a, and conductor 220g is configured to provide the second supply voltage of reference voltage supply VSS to gates 204a1, 204b1 and 204c1 by corresponding vias 212d, 212e, 212f thereby turning on the PMOS transistors in active region 202b. In some embodiments, the turned off PMOS/NMOS transistors also are referred to as corresponding tie-high/tie-low cells.

In some embodiments, at least conductor 220c, 220d, 220e or 220f of the set of conductors 220 is configured to provide the routing of signals, and thus conductors 220c, 220d, 220e and 220f are referred to as "signal lines." For example, conductor 220e is electrically coupled to conductor 230a by via 224a, and thus conductor 220e is configured to route signals to/from conductor 230a to other portions of integrated circuit 200 or other devices (not shown for ease of illustration).

In some embodiments, conductors 220d and 220e have corresponding removed conductor portions 222a and 222b of a set of removed conductor portions 222 that are removed during operation 1006 of FIG. 10 (described below).

Removed conductor portion 222a is separated from contact 206b or via 210e in the first direction by a distance S1b. Removed conductor portion 222b is separated from contact 206c or via 224a in the first direction by a distance S2b.

Other positions or number of removed conductor portions of the set of removed conductor portions 222 are within the scope of the present disclosure.

The set of vias 224 include one or more of vias 224a. In some embodiments, the set of vias 224 are between the set of conductors 230 and the set of conductors 220. The set of vias 224 is located where the set of conductors 230 overlap the set of conductors 220.

The set of vias 224 are configured to electrically couple the set of conductors 230 and the set of conductors 220 together. In some embodiments, at least a via of the set of vias 224 is configured to electrically couple a corresponding conductor of the set of conductors 230 to a corresponding conductor of the set of conductors 220. Via 224a is configured to electrically couple conductor 220e to corresponding conductor 230a together.

In some embodiments, one or more vias of set of vias 210, 212 or 224 have a square shape, a rectangular shape, a circular shape or a polygonal shape. Other lengths, widths and shapes for one or more vias of set of vias 210, 212 or 224 are in the scope of the present disclosure.

Other configurations, arrangements on other layout levels or quantities of vias in the set of vias 224 are within the scope of the present disclosure.

The set of conductors 230 includes one or more of conductors 230a. The set of conductors overlaps at least one conductor of the set of conductors 220, at least one contact of the set of contacts 206 or at least one active region of the set of active regions 202.

In some embodiments, the set of conductors 230 overlaps other underlying features (not shown for ease of illustration) of other layout levels of integrated circuit 200, 400, 500, 600, 700 or 800.

Other configurations, arrangements on other layout levels or quantities of conductors in the set of conductors 230 are within the scope of the present disclosure.

In some embodiments, by contacts 206a and 206d overlapping corresponding cell boundaries 201c and 201d, causes corresponding distances S1b and S2b between corresponding vias 210e and 224a and corresponding removed conductor portions 222a and 222b to be increased compared to other approaches. In some embodiments, by increasing distance S1b and S2b, the region of the corresponding conductors 220d and 220e that overlap corresponding vias 210e and 224a is sufficiently separated from the corresponding removed conductor portion 222a and 222b to not violate design rules, and thereby provides a larger via landing zone for corresponding vias 210e and 224a (or other vias in the VG, VD or V0 level) compared to other approaches, resulting in integrated circuits 200, 400, 500, 600, 700 and 800 that occupy less area than other approaches, and are manufactured with better manufacturing yield than other approaches.

In some embodiments, at least one gate region of the set of gates 204 are formed using a doped or non-doped polycrystalline silicon (or polysilicon). In some embodiments, at least one gate region of the set of gates 204 include a metal, such as Al, Cu, W, Ti, Ta, TiN, TaN, NiSi, CoSi, other suitable conductive materials, or combinations thereof.

In some embodiments, at least one conductor of the set of contacts 206, at least one conductor of the set of conductors 220, at least one via of the set of vias 210, at least one via of the set of vias 212, at least one via of the set of vias 224, or at least one conductor of the set of conductors 230 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, $TiSi_x$, $NiSi_x$, TiN, TaN, or the like. In some embodiments, a doped semiconductor includes at least doped silicon, or the like.

Other materials, configurations, arrangements on other layout levels or quantities of elements in integrated circuit 200 are within the scope of the present disclosure.

FIG. 3 is a diagram of a layout design 300 of an integrated circuit, in accordance with some embodiments.

Layout design 300 is a variation of layout design 100 (FIGS. 1A-1D), and similar detailed description is therefore omitted. For example, layout design 300 illustrates an example of where multiple standard cells are arranged next to each other in an array of cells 310.

Layout design 300 includes the array of cells 310 arranged in 1 row and at least 2 columns. Other row numbers and column numbers are within the scope of the present disclosure. In some embodiments, each cell of the array of cells 310 corresponds to a cell manufactured by layout design 100. In some embodiments, each cell of the array of cells 310 corresponds to a portion of integrated circuit 200, simplified for ease of illustration. For example, the V0 level and the M1 level are not shown in FIG. 3 for ease of illustration.

The array of cells 310 includes layout designs 302 and 304 arranged in corresponding columns 1 and 2.

In some embodiments, the set of active region patterns 102 extends continuously through the cell boundaries 101c or 101e of layout design 300 to other neighboring cells. In some embodiments, by the set of active region patterns 102 extending continuously through the cell boundaries 101c or 101e of layout design 300 to other neighboring cells, thereby causing an increase in the compressive strain of integrated circuit 200, 400, 500, 600, 700 or 800 (described below) and layout design 300 compared to other approaches. By increasing the compressive strain of integrated circuit 200, 400, 500, 600, 700 or 800 and layout design 300, the driving current capability of integrated circuit 200, 400, 500, 600, 700 or 800 and layout design 300 is increased, and integrated circuit 200 and layout design 300 have better performance than other approaches. In some embodiments, by having an improved compressive strain, integrated circuit 200, 400, 500, 600, 700 or 800 or layout design 300 can have similar driving current capability as other approaches while occupying less area than the other approaches resulting in an overall reduction in physical size of layout design 300 or integrated circuit 200, 400, 500, 600, 700 or 800.

Other configurations, arrangements on other layout levels or quantities of elements in layout design 300 are within the scope of the present disclosure.

Figure 4:
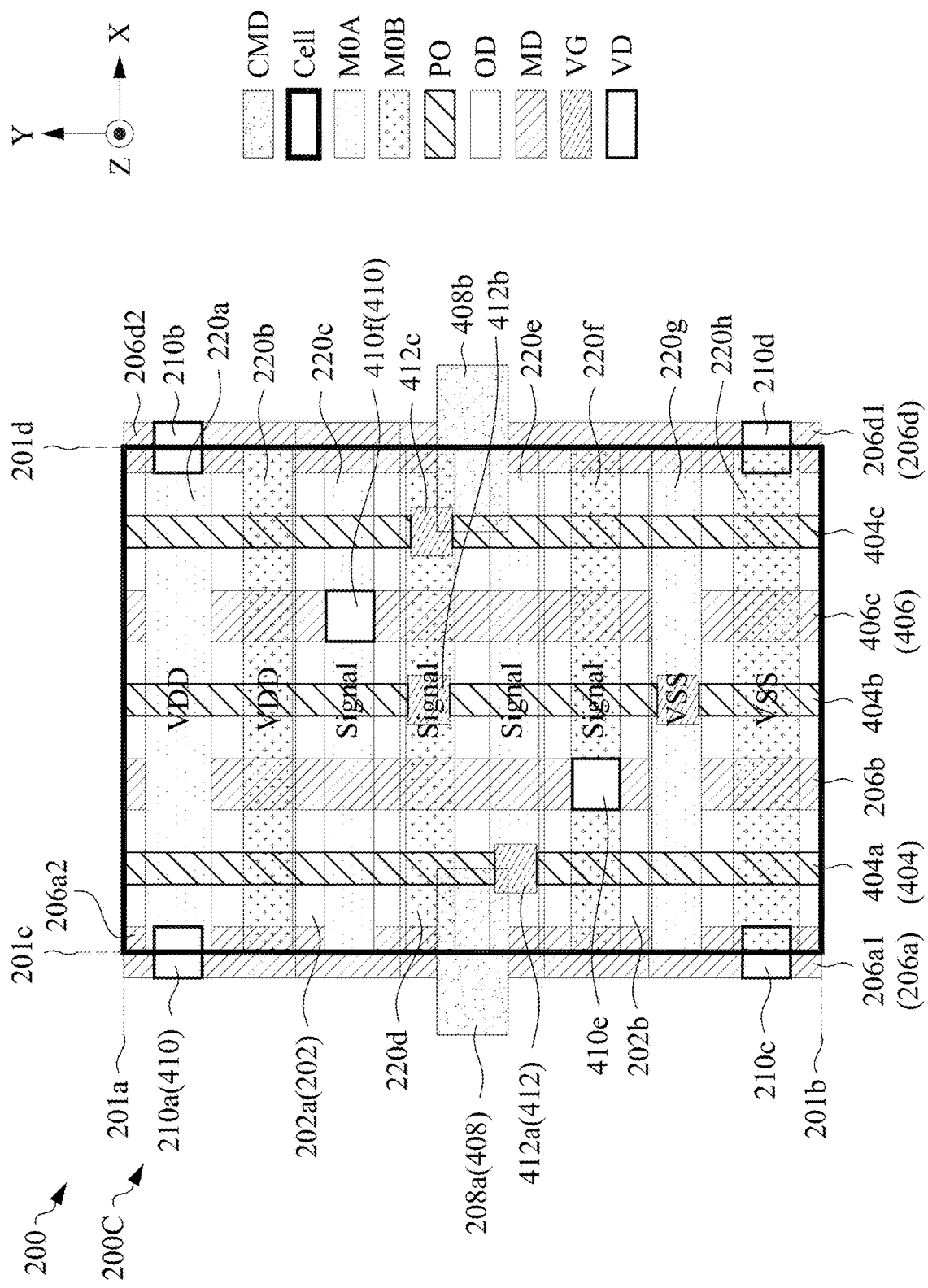
FIG. 4 is a diagram of an integrated circuit, in accordance with some embodiments.

FIG. 4 is a top view of an integrated circuit 400, in accordance with some embodiments.

Integrated circuit 400 is manufactured by a corresponding layout design similar to integrated circuit 400. For brevity FIGS. 4-8 are described as a corresponding integrated circuit 400-800, but in some embodiments, FIGS. 4-8 also correspond to layout designs similar to layout designs 100 or 300, structural elements of integrated circuit 400-800 also correspond to layout patterns, and structural relationships including alignment, lengths and widths, as well as configurations and layers of a corresponding layout design of integrated circuit 400-800 are similar to the structural relationships and configurations and layers of integrated circuit 400-800, and similar detailed description will not be described for brevity.

In some embodiments, at least integrated circuit 400, 500, 600, 700 or 800 is manufactured by a layout design similar to layout design 100, and similar detailed description is therefore omitted. Structural relationships including alignment, lengths and widths, as well as configurations and layers of at least integrated circuit 400, 500, 600, 700 or 800 are similar to the structural relationships and configurations and layers of integrated circuit 200 of FIGS. 2A-2D, and similar detailed description will not be described in at least FIGS. 4-8, for brevity.

Integrated circuit 400 is a variation of integrated circuit 200 (FIGS. 2A-2H), and similar detailed description is therefore omitted. For example, integrated circuit 400 illustrates an example of where a set of gates 404 are not coupled to power supply VDD or VSS by conductors 220b and 220g.

Integrated circuit 400 includes at least the set of active regions 202, the set of gates 404, insulating region 203, a set of contacts 406, a set of vias 410, a set of vias 412, and the set of conductors 220.

The set of gates 404 replace the set of gates 204 of FIGS. 2A-2H, the set of contacts 406 replace the set of contacts 206 of FIGS. 2A-2H, the set of vias 410 replace the set of vias 210 of FIGS. 2A-2H, and the set of vias 412 replace the set of vias 212 of FIGS. 2A-2H, and similar detailed description is therefore omitted.

In comparison with set of gates 204 of FIGS. 2A-2H, the set of gates 404 are not divided by a removed gate portion 205 similar to poly cut feature pattern 105, and similar detailed description is therefore omitted.

The set of gates 404 includes at least gate 404a, 404b or 404c. Gate 404a, 404b and 404c replaces corresponding gate 204a, 204b and 204c of FIGS. 2A-2H, and similar detailed description is therefore omitted. Each of corresponding gate 404a, 404b or 404c is not divided by a removed gate portion 205, and is a corresponding single, continuous gate structure.

Other configurations, arrangements on other layout levels or quantities of gates in the set of gates 404 are within the scope of the present disclosure.

The set of contacts 406 includes at least contact 206a, 206b, 406c or 206d. Contact 406c replaces corresponding contact 206c of FIGS. 2A-2H, and similar detailed description is therefore omitted. Contact 406c is not divided by a removed contact portion 208b, and is thus a single, continuous contact structure.

In comparison with FIGS. 2A-2H, a removed contact portion 408b of FIG. 4 replaces removed contact portion 208b of FIGS. 2A-2H, and similar detailed description is therefore omitted. Removed contact portion 408b corresponds to the removed portion of contact 206d.

Contact 406c electrically couples the source/drain of transistors in active region 202a and the source/drain of transistors in active region 202b together.

Other configurations, arrangements on other layout levels or quantities of contacts in the set of contacts 406 are within the scope of the present disclosure.

The set of vias 410 includes at least via 210a, 210b, 210c, 210d, 410e or 410f.

In comparison with integrated circuit 200, at least via 410e or 410f is similar to at least via 210a, 210b, 210c, 210d, and similar detailed description is therefore omitted.

Via 410e is between conductor 220f and contact 206b. Via 410e is configured to electrically couple conductor 220f and contact 206b together. Conductor 220f is electrically coupled to the source/drain of transistors of active region 202a and the source/drain of transistors of active region 202b by contact 206b and via 410e.

Via 410f is between conductor 220c and contact 406c. Via 410f is configured to electrically couple conductor 220c and contact 406c together. Conductor 220c is electrically coupled to the source/drain of transistors of active region 202a and the source/drain of transistors of active region 202b by contact 406c and via 410f.

Other configurations, arrangements on other layout levels or quantities of vias in the set of vias 410 are within the scope of the present disclosure.

The set of vias 412 includes at least via 412a, 412b or 412c.

In comparison with integrated circuit 200, vias 412a, 412b and 412c replace vias 212a, 212b, 212c, 212d, 212e and 212f, and similar detailed description is therefore omitted.

Via 412a is between conductor 220e and gate 404a. Via 412a is configured to electrically couple conductor 220e and gate 404a together.

Via 412b is between conductor 220d and gate 404b. Via 412b is configured to electrically couple conductor 220d and gate 404b together.

Via 412c is between conductor 220d and gate 404c. Via 412c is configured to electrically couple conductor 220d and gate 404c together.

In comparison with integrated circuit 200 of FIGS. 2A-2H, vias 412a, 412b and 412c are not directly coupled to power rails (e.g., conductors 220b and 220g (which are configured to supply the first supply voltage of voltage supply VDD and the second supply voltage of reference voltage supply VSS)), and the PMOS/NMOS transistors of gates 404a, 404b and 404c coupled to corresponding vias 412a, 412b and 412c are not in a constant turned off/on state, and instead are directly coupled to signal lines (e.g., conductors 220d and 220e). In some embodiments, by being directly coupled to a signal line (e.g., conductor 220e), the PMOS/NMOS transistors of gate 404a are coupled to conductor 220e by via 412a, and are turned on or off by a corresponding signal on signal line (e.g., conductor 220e). In some embodiments, by being directly coupled to a signal line (e.g., conductor 220d) by vias 412b and 412c, the PMOS/NMOS transistors of corresponding gates 404b and 404c are turned on or off by a corresponding signal on signal line (e.g., conductor 220d).

Other configurations, arrangements on other layout levels or quantities of vias in the set of vias 412 are within the scope of the present disclosure.

Other materials, configurations, arrangements on other layout levels or quantities of elements in integrated circuit 400 are within the scope of the present disclosure.

In some embodiments, integrated circuit 400 achieves one or more of the benefits discussed above in at least FIGS. 1A-1D, 2A-2H and 3.

Figure 5:
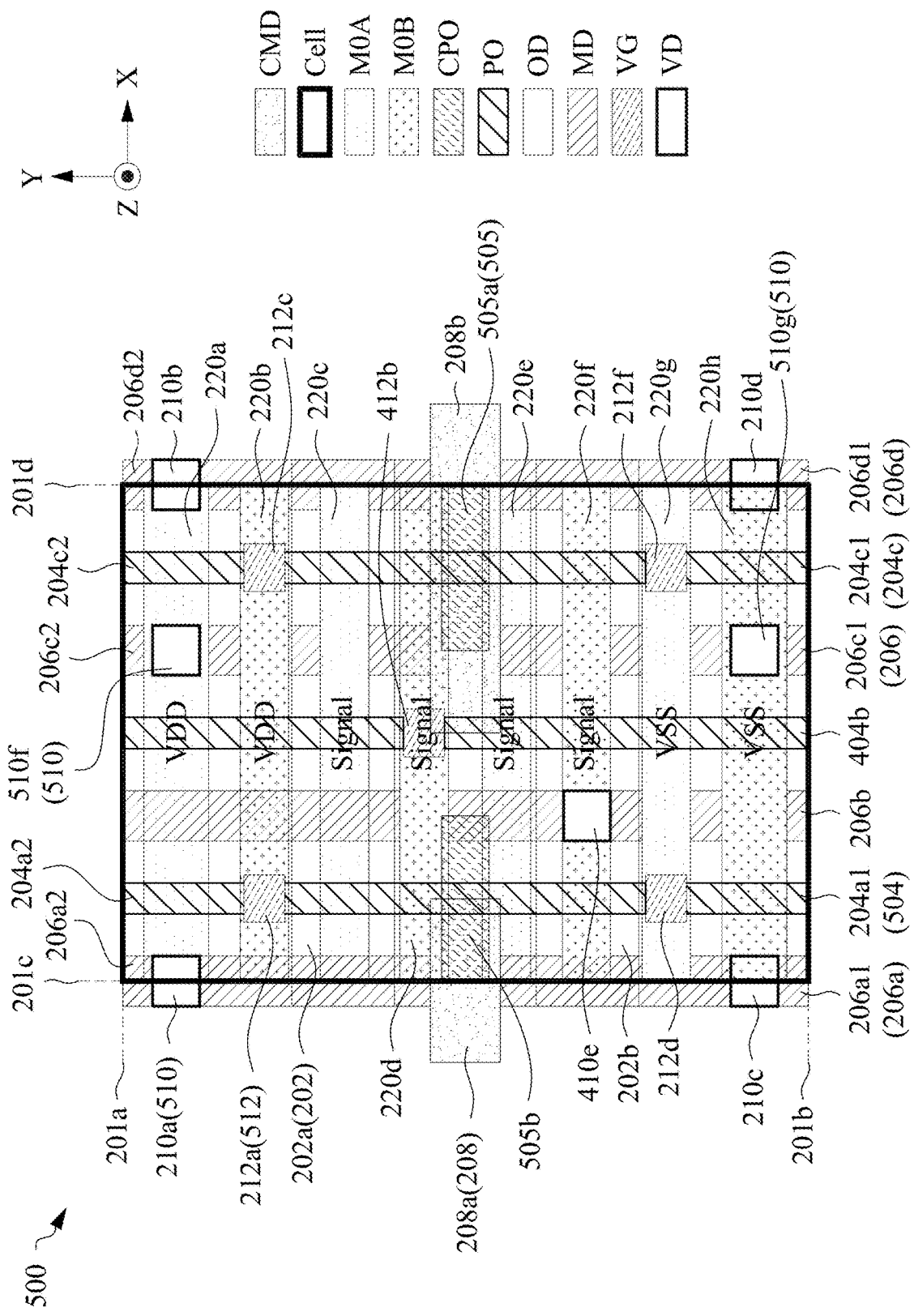
FIG. 5 is a diagram of an integrated circuit, in accordance with some embodiments.

FIG. 5 is a top view of an integrated circuit 500, in accordance with some embodiments.

Integrated circuit 500 is manufactured by a corresponding layout design similar to layout design 100 or a layout design similar to integrated circuit 500.

Integrated circuit 500 is a variation of integrated circuit 200 (FIGS. 2A-2H) and integrated circuit 400 (FIG. 4), and similar detailed description is therefore omitted. For example, a set of gates 504 replace the set of gates 204 of FIGS. 2A-2H or the set of gates 404 of FIG. 4, a set of vias 510 replace the set of vias 210 of FIGS. 2A-2H or the set of vias 410 of FIG. 4, and a set of vias 512 replace the set of vias 212 of FIGS. 2A-2H or the set of vias 412 of FIG. 4, and similar detailed description is therefore omitted.

Integrated circuit 500 includes at least the set of active regions 202, the set of gates 504, insulating region 203, the set of contacts 206, the set of vias 510, the set of vias 512, and the set of conductors 220.

The set of gates 504 includes at least gate 204a, 404b or 204c of FIGS. 2A-2H and 4, and similar detailed description is therefore omitted.

Gate 204a is separated by a removed gate portion 505a, and gate 204c is separated by a removed gate portion 505b. In comparison with FIGS. 2A-2H, the removed gate portions 505a and 505b of FIG. 5 replace the removed gate portion 205a of FIGS. 2A-2H, and similar detailed description is therefore omitted. Gate 404b is not divided by the removed gate portions 505a and 505b, and is a corresponding single, continuous gate structure.

Other configurations, arrangements on other layout levels or quantities of gates in the set of gates 504 are within the scope of the present disclosure.

The set of vias 510 includes at least via 210a, 210b, 210c, 210d, 410e or 510f.

In comparison with integrated circuit 400, via 510f replaces via 410f, and similar detailed description is therefore omitted.

Via 510f is between conductor 220a and contact 206c2. Via 510f is configured to electrically couple conductor 220a and contact 206c2 together. Conductor 220a is electrically coupled to the source/drain of transistors of active region 202a by contact 206c2 and via 510f.

Other configurations, arrangements on other layout levels or quantities of vias in the set of vias 510 are within the scope of the present disclosure.

The set of vias 512 includes at least via 212a, 212c, 212d, 212f and 412b.

In some embodiments, vias 212a and 212c are directly coupled to the VDD power rail (e.g., conductor 220b (which is configured to supply the first supply voltage of voltage supply VDD)), and the PMOS/NMOS transistors of gates 204a2 and 204c2 that are coupled to corresponding vias 212a and 212c are in a constant turned off/on state.

In some embodiments, vias 212d and 212f are directly coupled to the VSS power rail (e.g., conductor 220g (which is configured to supply the second supply voltage of reference voltage supply VSS)), and the NMOS/PMOS transistors of gates 204a1 and 204c1 that are coupled to corresponding vias 212d and 212f are in a constant turned off/on state.

In some embodiments, via 412b is not directly coupled to power rails (e.g., conductors 220b and 220g (which are configured to supply the first supply voltage of voltage supply VDD and the second supply voltage of reference voltage supply VSS)), and the PMOS/NMOS transistors of gate 404b that is coupled to corresponding via 412b are not in a constant turned off/on state, and instead are directly coupled to signal lines (e.g., conductor 220d).

Other configurations, arrangements on other layout levels or quantities of vias in the set of vias 512 are within the scope of the present disclosure.

Other materials, configurations, arrangements on other layout levels or quantities of elements in integrated circuit 500 are within the scope of the present disclosure.

In some embodiments, integrated circuit 500 achieves one or more of the benefits discussed above in at least FIGS. 1A-1D, 2A-2H and 3.

Figure 6:
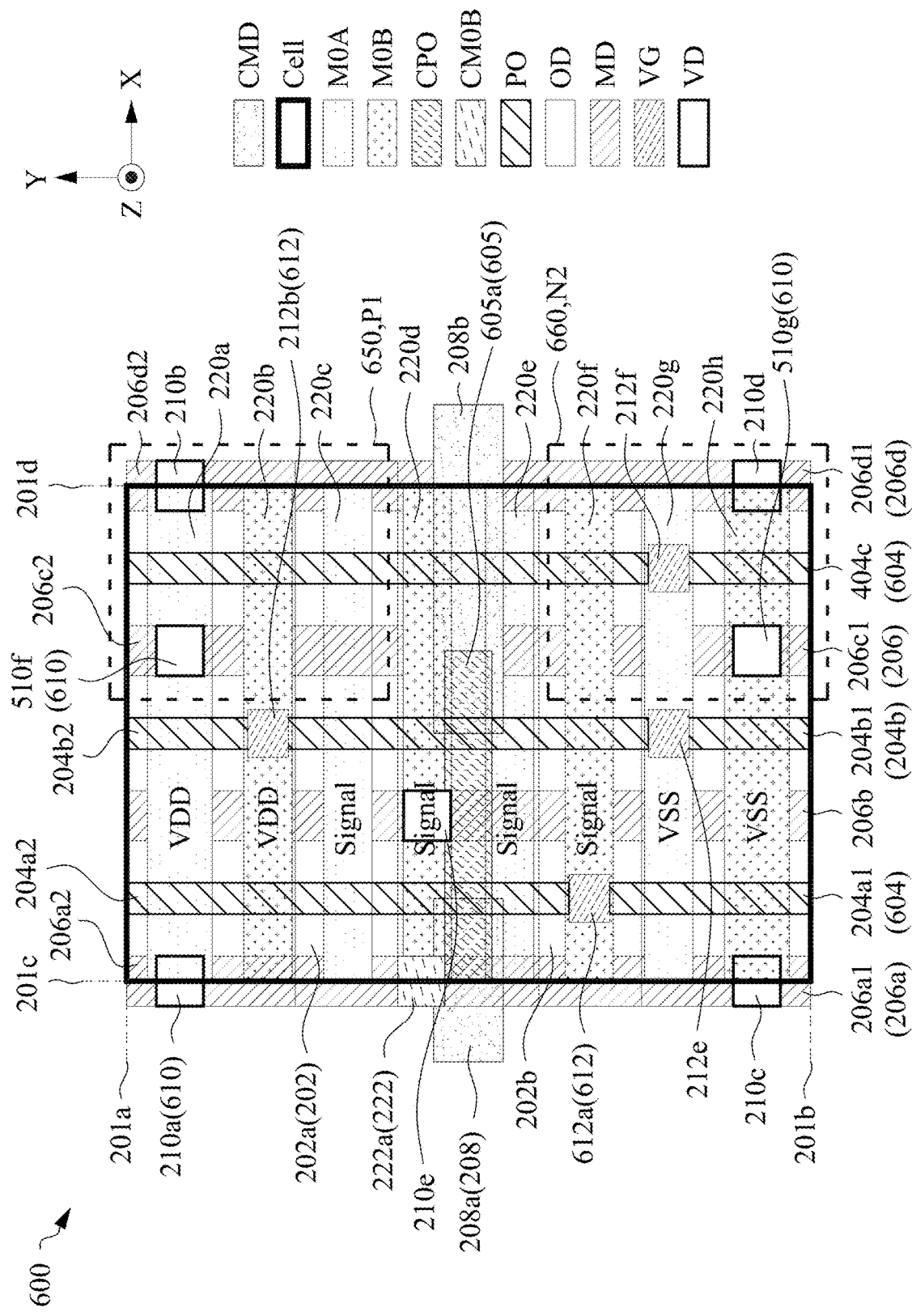
FIG. 6 is a diagram of an integrated circuit, in accordance with some embodiments.

FIG. 6 is a top view of an integrated circuit 600, in accordance with some embodiments.

Integrated circuit 600 is manufactured by a corresponding layout design similar to layout design 100 or a layout design similar to integrated circuit 600.

Integrated circuit 600 is a variation of integrated circuit 200 (FIGS. 2A-2H), integrated circuit 400 (FIG. 4) and integrated circuit 500 (FIG. 5), and similar detailed description is therefore omitted. For example, a set of gates 604 replace the set of gates 204 of FIGS. 2A-2H or the set of gates 404 of FIG. 4, a set of vias 610 replace the set of vias 210 of FIGS. 2A-2H or the set of vias 510 of FIG. 5, and a set of vias 612 replace the set of vias 212 of FIGS. 2A-2H or the set of vias 512 of FIG. 5, and similar detailed description is therefore omitted.

Integrated circuit 600 includes at least the set of active regions 202, the set of gates 604, insulating region 203, the set of contacts 206, the set of vias 610, the set of vias 612, and the set of conductors 220.

The set of gates 604 includes at least gate 204a, 204b or 404c of FIGS. 2A-2H and 4, and similar detailed description is therefore omitted.

Gates 204a1 and 204a2 are separated from each other by a removed gate portion 605a. Gates 204b1 and 204b2 are separated from each other by the removed gate portion 605a. In comparison with FIGS. 2A-2H, the removed gate portion 605a of FIG. 5 replaces the removed gate portion 205a of FIGS. 2A-2H, and similar detailed description is therefore omitted. Gate 404c is not divided by the removed gate portion 605a, and is a corresponding single, continuous gate structure.

Other configurations, arrangements on other layout levels or quantities of gates in the set of gates 604 are within the scope of the present disclosure.

The set of vias 610 includes at least via 210a, 210b, 210c, 210d, 210e or 510f.

In comparison with integrated circuit 500, via 210e replaces via 410e, and similar detailed description is therefore omitted.

Via 210e is between conductor 220d and contact 206b. Via 210e is configured to electrically couple conductor 220d and contact 206b together. Conductor 220d is electrically coupled to the sources/drains of transistors of active regions 202a and 202b by contact 206b and via 210e.

Other configurations, arrangements on other layout levels or quantities of vias in the set of vias 610 are within the scope of the present disclosure.

The set of vias 612 includes at least via 212b, 212e, 212f and 612a.

In comparison with integrated circuit 500, via 612a replaces via 212d, and similar detailed description is therefore omitted.

In comparison with via 212d, via 612a is not directly coupled to a power rail (e.g., conductor 220g (which is configured to supply the second supply voltage of reference voltage supply VSS)), and the NMOS/PMOS transistors of gate 204a1 coupled to corresponding via 612a is not in a constant turned off/on state, and instead is directly coupled to a signal line (e.g., conductor 220f). In some embodiments, by being directly coupled to a signal line (e.g., conductor 220f) by via 612a, the NMOS/PMOS transistors of gate 204a1 is turned on or off by a corresponding signal on signal line (e.g., conductor 2200).

Other configurations, arrangements on other layout levels or quantities of vias in the set of vias 612 are within the scope of the present disclosure.

Integrated circuit 600 further includes a region that corresponds to a capacitor 650.

In some embodiments, active region 202a includes P-type dopants corresponding to PMOS transistors that include PMOS transistor P1, and active region 202b includes N-type dopants corresponding to NMOS transistors that include NMOS transistor N1.

In some embodiments, the drain (e.g., contact 206c2 or 206d2) and source (e.g., contact 206d2 or 206c2) of PMOS transistor P1 are connected to voltage supply VDD, and the gate 404c of PMOS transistor P1 is connected to reference voltage supply VSS, thereby forming the capacitor 650.

In some embodiments, capacitor 650 is configured to provide extra capacitance to integrated circuit 600 thereby stabilizing one or more power signals (e.g., the first supply voltage of voltage supply VDD or the second supply voltage of reference voltage supply VSS), and reducing noise in the one or more power signals compared to other approaches.

In some embodiments, capacitor 650 is integrated within integrated circuit 600 thereby increasing area utilization compared to other approaches where a capacitor may be provided outside of the standard cell or integrated circuit and occupies more area.

Integrated circuit 600 further includes a region that corresponds to a dummy transistor 660.

In some embodiments, the drain (e.g., contact 206c1 or 206d1) of NMOS transistor N1, the source (e.g., contact 206d1 or 206c1) of NMOS transistor N1, and the gate 404c of NMOS transistor N1 are connected to reference voltage supply VSS, thereby turning off NMOS transistor N1 and forming the dummy transistor 660.

In some embodiments, turning off NMOS transistor N1 reduces leakage current between NMOS transistor N1 and adjacent transistors in at least the first direction X at cell boundaries 201c and 201d, thereby allowing NMOS transistor N1 and adjacent transistors to be spaced closer together compared to other approaches, thus reducing the area of integrated circuit 600. In some embodiments, adjacent transistors are transistors directly next to NMOS transistor N1.

Other locations, configurations, arrangements on other layout levels or quantities of elements in capacitor 650 or dummy transistor 660 are within the scope of the present disclosure.

Other materials, configurations, arrangements on other layout levels or quantities of elements in integrated circuit 600 are within the scope of the present disclosure.

In some embodiments, integrated circuit 600 achieves one or more of the benefits discussed above in at least FIGS. 1A-1D, 2A-2H and 3.

Figure 7:
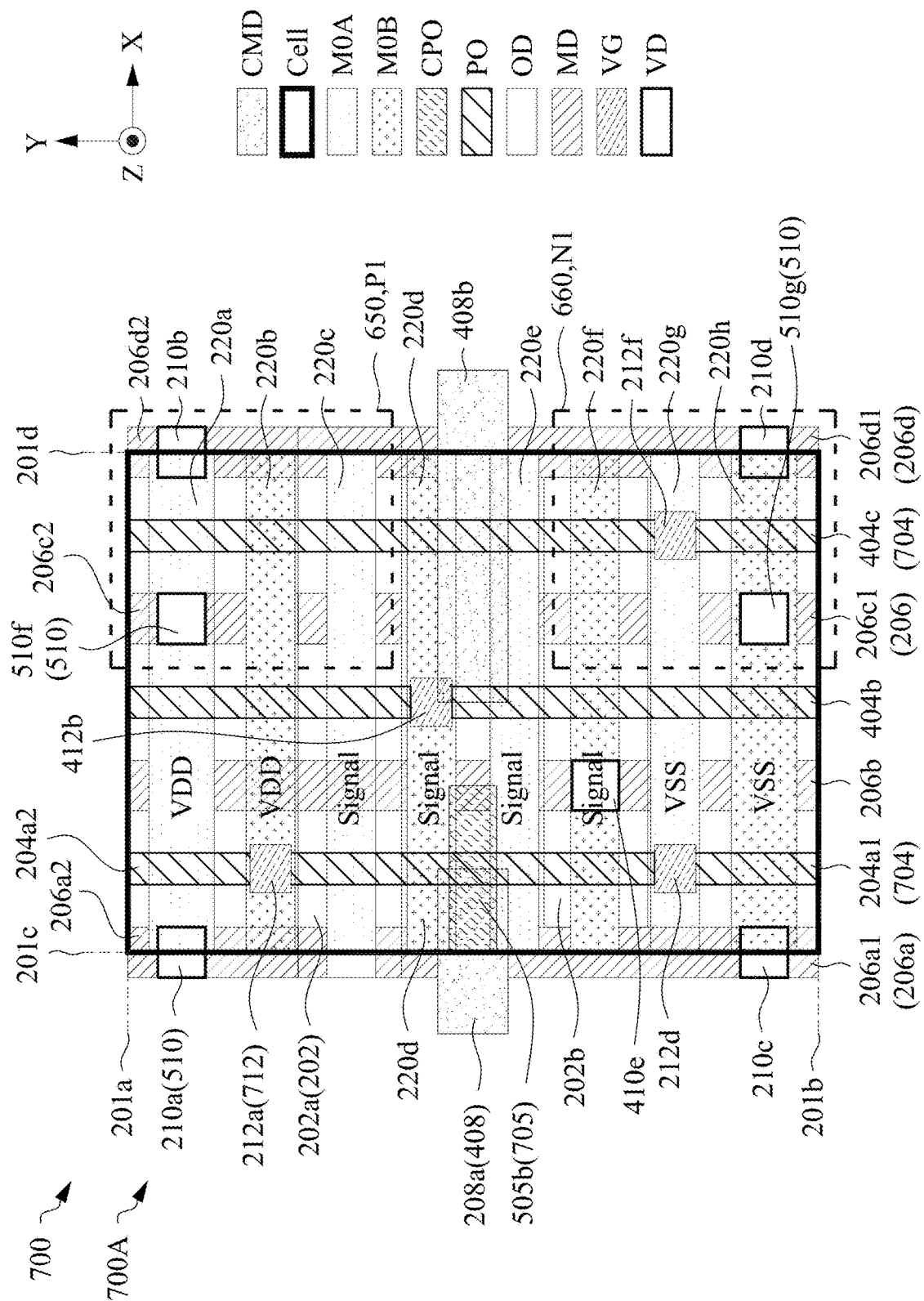
FIG. 7 is a diagram of an integrated circuit, in accordance with some embodiments.

FIG. 7 is a top view of an integrated circuit 700, in accordance with some embodiments.

Integrated circuit 700 is manufactured by a corresponding layout design similar to layout design 100 or a layout design similar to integrated circuit 700.

Integrated circuit 700 is a variation of integrated circuit 200 (FIGS. 2A-2H), integrated circuit 400 (FIG. 4), integrated circuit 500 (FIG. 5) and integrated circuit 600 (FIG. 6), and similar detailed description is therefore omitted. For example, a set of gates 704 replace the set of gates 204 of FIGS. 2A-2H or the set of gates 404 of FIG. 4, and a set of vias 712 replace the set of vias 212 of FIGS. 2A-2H or the set of vias 512 of FIG. 5, and similar detailed description is therefore omitted.

Integrated circuit 700 includes at least the set of active regions 202, the set of gates 704, insulating region 203, the set of contacts 206, the set of vias 510, the set of vias 612, and the set of conductors 220.

The set of gates 604 includes at least gate 204a, 404b or 404c of FIGS. 2A-2H and 4, and similar detailed description is therefore omitted.

Gates 204a1 and 204a2 are separated from each other by a removed gate portion 505b of a set of removed gate portions 705. In comparison with FIGS. 2A-2H, the removed gate portion 505b of FIG. 7 replaces the removed gate portion 205a of FIGS. 2A-2H, and similar detailed description is therefore omitted. Gate 404b is not divided by the removed gate portion 505b, and is a corresponding single, continuous gate structure. Gate 404c is not divided by the removed gate portion 505b, and is a corresponding single, continuous gate structure.

Other configurations, arrangements on other layout levels or quantities of gates in the set of gates 704 are within the scope of the present disclosure.

The set of vias 712 includes at least via 212a, 212d, 212f and 412b.

In comparison with integrated circuit 500, the set of vias 712 does not include via 212c, and similar detailed description is therefore omitted. In some embodiments, by including the set of vias 612 instead of the set of vias 512, integrated circuit 700 achieves one or more of the benefits discussed above in FIG. 5, and similar detailed description is therefore omitted. For example, in some embodiments, gate 204a2 of a PMOS transistor is connected to the first supply voltage of voltage supply VDD by via 212a, thereby turning off the PMOS transistor. For example, in some embodiments, gates 204a1 of an NMOS transistor is connected to the reference voltage supply VSS by via 212d, thereby turning off the NMOS transistor. For example, in some embodiments, gate 404c of NMOS transistor N1 and PMOS transistor P1 is connected to the reference voltage supply VSS by via 212f, thereby turning off NMOS transistor N1.

Other configurations, arrangements on other layout levels or quantities of vias in the set of vias 712 are within the scope of the present disclosure.

Integrated circuit 700 further includes the region that corresponds to the capacitor 650, and the region that corresponds to the dummy transistor 660 of FIG. 6, and similar detailed description is therefore omitted.

In some embodiments, by including the capacitor 650, and the dummy transistor 660, integrated circuit 700 achieves one or more of the benefits discussed above in FIG. 6.

Other materials, configurations, arrangements on other layout levels or quantities of elements in integrated circuit 700 are within the scope of the present disclosure.

In some embodiments, integrated circuit 700 achieves one or more of the benefits discussed above in at least FIGS. 1A-1D, 2A-2H and 3.

Figure 8:
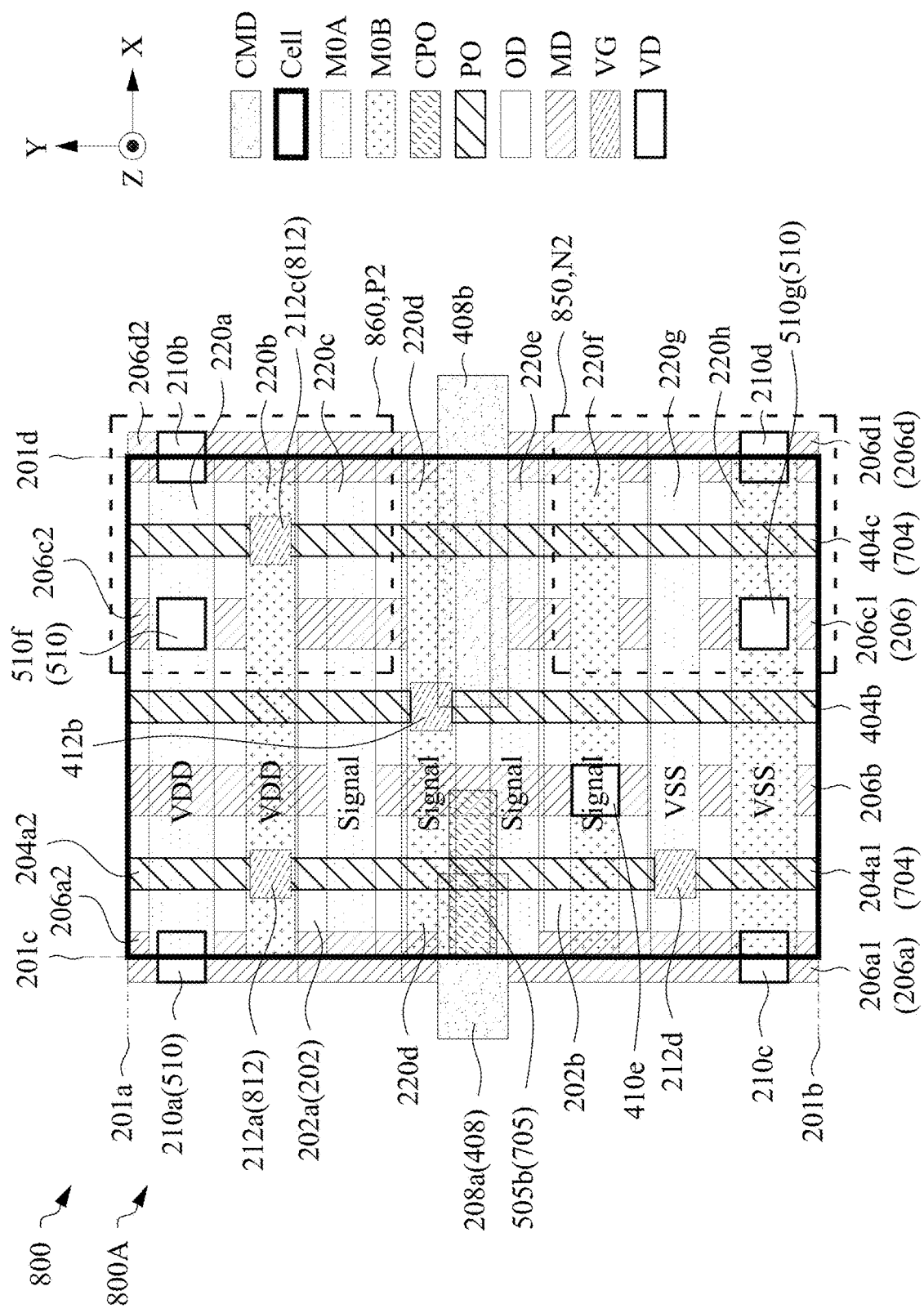
FIG. 8 is a diagram of an integrated circuit, in accordance with some embodiments.

FIG. 8 is a top view of an integrated circuit 800, in accordance with some embodiments.

Integrated circuit 800 is manufactured by a corresponding layout design similar to layout design 100 or a layout design similar to integrated circuit 800.

Integrated circuit 800 is a variation of integrated circuit 200 (FIGS. 2A-2H), integrated circuit 400 (FIG. 4), integrated circuit 500 (FIG. 5), integrated circuit 600 (FIG. 6) and integrated circuit 700 (FIG. 7), and similar detailed description is therefore omitted. For example, in comparison with integrated circuit 600, a set of vias 812 replaces the set of vias 712 of FIG. 7, and similar detailed description is therefore omitted.

Integrated circuit 800 includes at least the set of active regions 202, the set of gates 704, insulating region 203, the set of contacts 206, the set of vias 510, the set of vias 812, and the set of conductors 220.

The set of vias 812 includes at least via 212a, 212c, 212d and 412b.

In comparison with integrated circuit 700, via 212c of FIG. 8 replaces via 212f of FIG. 7, and similar detailed description is therefore omitted.

In some embodiments, by including the set of vias 812 instead of the set of vias 512 or 712, integrated circuit 800 achieves one or more of the benefits discussed above in FIGS. 5 and 7, and similar detailed description is therefore omitted. For example, in some embodiments, gate 204a2 of a PMOS transistor is connected to the first supply voltage of voltage supply VDD by via 212a, thereby turning off the PMOS transistor. For example, in some embodiments, gates 204a1 of an NMOS transistor is connected to the reference voltage supply VSS by via 212d, thereby turning off the NMOS transistor. For example, in some embodiments, gate 404c of NMOS transistor N2 and PMOS transistor P2 is connected to the first supply voltage of voltage supply VDD by via 212c, thereby turning off PMOS transistor P2.

Other configurations, arrangements on other layout levels or quantities of vias in the set of vias 812 are within the scope of the present disclosure.

Integrated circuit 800 further includes a region that corresponds to a capacitor 850. In comparison with integrated circuit 600 or 700, capacitor 850 replaces capacitor 650 of FIGS. 6-7, and similar detailed description is therefore omitted.

In some embodiments, active region 202a includes P-type dopants corresponding to PMOS transistors that include PMOS transistor P2, and active region 202b includes N-type dopants corresponding to NMOS transistors that include NMOS transistor N2.

In some embodiments, the drain (e.g., contact 206c1 or 206d1) of NMOS transistor N2 and the source (e.g., contact 206d1 or 206c1) of NMOS transistor N2 are connected to reference voltage supply VSS, and the gate 404c of NMOS transistor N1 is connected to voltage supply VDD, thereby forming the capacitor 850.

In some embodiments, capacitor 850 is configured to provide extra capacitance to integrated circuit 800 thereby stabilizing one or more power signals (e.g., the first supply voltage of voltage supply VDD or the second supply voltage of reference voltage supply VSS), and reducing noise in the one or more power signals compared to other approaches.

In some embodiments, capacitor 850 is integrated within integrated circuit 800 thereby increasing area utilization compared to other approaches where a capacitor may be provided outside of the standard cell or integrated circuit and occupies more area.

Integrated circuit 800 further includes a region that corresponds to a dummy transistor 860. In comparison with integrated circuit 600 or 700, dummy transistor 860 replaces dummy transistor 660 of FIGS. 6-7, and similar detailed description is therefore omitted.

In some embodiments, the drain (e.g., contact 206c2 or 206d2) of PMOS transistor P2, the source (e.g., contact 206d2 or 206c2) of PMOS transistor P2 and the gate 404c of PMOS transistor P1 are connected to voltage supply VDD, thereby turning off PMOS transistor P2 and forming the dummy transistor 860.

In some embodiments, turning off PMOS transistor P2 reduces leakage current between PMOS transistor P2 and adjacent transistors in at least the first direction X at cell boundaries 201c and 201d, thereby allowing PMOS transistor P2 and adjacent transistors to be spaced closer together compared to other approaches, thus reducing the area of integrated circuit 800.

Other locations, configurations, arrangements on other layout levels or quantities of elements in capacitor 850 or dummy transistor 860 are within the scope of the present disclosure.

Other materials, configurations, arrangements on other layout levels or quantities of elements in integrated circuit 800 are within the scope of the present disclosure.

In some embodiments, integrated circuit 800 achieves one or more of the benefits discussed above in at least FIGS. 1A-1D, 2A-2H and 3.

FIG. 9 is a functional flow chart of a method of manufacturing an IC device, in accordance with some embodiments. It is understood that additional operations may be performed before, during, and/or after the method 900 depicted in FIG. 9, and that some other processes may only be briefly described herein.

In some embodiments, other order of operations of method 900 is within the scope of the present disclosure. Method 900 includes exemplary operations, but the operations are not necessarily performed in the order shown. Operations may be combined, divided, added, replaced, changed order, and/or eliminated as appropriate, in accordance with the spirit and scope of disclosed embodiments. In some embodiments, one or more of the operations of at least method 900, 1000 or 1100 is not performed.

In some embodiments, method 900 is an embodiment of operations 1004 and 1006 of method 1000. In some embodiments, the method 900 is usable to manufacture or fabricate at least integrated circuit 200, 400, 500, 600, 700, or 800, or an integrated circuit with similar features as at least layout design 100 or 300.

In some embodiments, other order of operations of methods 900 are within the scope of the present disclosure. Method 900 includes exemplary operations, but the operations are not necessarily performed in the order shown. Operations may be added, replaced, changed order, and/or eliminated as appropriate, in accordance with the spirit and scope of disclosed embodiments.

In operation 902 of method 900, a set of active regions 202 of a set of transistors is formed in a front-side of a substrate 290. In some embodiments, the set of transistors of method 900 includes one or more transistors in the set of active regions 202. In some embodiments, the set of transistors of method 900 includes one or more transistors described herein.

In some embodiments, operation 902 further includes at least operation 902a. In some embodiments, operation 902a (not shown) includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1 \times 10^{12}$ atoms/cm$^3$ to $1 \times 10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^2$ to about $1 \times 10^{14}$ atoms/cm$^2$. Other dopant concentrations are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In operation 904 of method 900, a first conductive material is deposited over source/drain regions of the set of transistors on a first level thereby forming a first set of contacts and a second set of contacts of the set of transistors. In some embodiments, the first level of method 900 includes the MD level or the POLY level.

In some embodiments, the source/drain regions of the set of transistors of method 900 includes the source/drain regions of one or more transistors in the set of active regions 202. In some embodiments, the set of contacts of method 900 include at least the set of contacts 206 or 406. In some embodiments, the set of contacts of method 900 includes features in the MD level.

In operation 906 of method 900, a first cut process is performed to remove portions of the first set of contacts and the second set of contacts. In some embodiments, the removed portions of the first set of contacts and the second set of contacts of method 900 includes features similar to at least the contact portions of contacts 208a, 208b or 408b. In some embodiments, the removed portions of the set of contacts of method 900 includes features in the MD level.

In some embodiments, further details of operation 906, 910 and 918 are described in operation 1006 of method 1000 (FIG. 10).

In operation 908 of method 900, a set of gates of the set of transistors is formed on the second level. In some embodiments, the set of gates of method 900 includes gate regions that include the set of gates 204, 404, 504, 604 or 704. In some embodiments, the second level of method 900 includes the POLY level.

In some embodiments, the gate region is between the drain region and the source region. In some embodiments, the gate region is over the first well and the substrate. In some embodiments, fabricating the gate regions of operation 906 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 910 of method 900, a second cut process is performed to remove portions of the set of gates. In some embodiments, the removed portions of the set of gates of method 900 includes features similar to at least the removed gate portions of gate structure 205a, 505a, 505b or 605a. In some embodiments, the removed portions of the set of gates of method 900 includes features in the POLY level.

In operation 912 of method 900, a first set of vias and a second set of vias are formed.

In some embodiments, the first set of vias of method 900 are in the VD level. In some embodiments, the first set of vias of method 900 includes at least the set of vias 210, 410, 510 or 610.

In some embodiments, the second set of vias of method 900 are in the VG level. In some embodiments, the second set of vias of method 900 includes at least the set of vias 212, 412, 512, 612, 712 or 812.

In some embodiments, the first set of vias are formed over the first set of contacts. In some embodiments, the second set of vias are formed over the set of gates.

In some embodiments, operation 912 includes forming a first and second set of self-aligned contacts (SACs) in the insulating layer over the front-side of the wafer. In some embodiments, the first and second set of vias are electrically coupled to at least the set of transistors.

In operation 914 of method 900, a second conductive material is deposited on a third level thereby forming a first set of power rails and a first set of signal lines. In some embodiments, the third level of method 900 includes the M0 layer. In some embodiments, operation 914 includes at least depositing a first set of conductive regions over the front-side of the integrated circuit.

In some embodiments, the first set of power rails of method 900 includes one or more portions of at least conductors 220a or 220g. In some embodiments, the first set of signal lines of method 900 includes one or more portions of at least conductors 220c or 220e.

In some embodiments, operation 914 is performed by a first M0 mask, and operation 916 is performed by a second M0 mask different from the first M0 mask.

In some embodiments, the first set of power rails is electrically coupled to at least the first set of contacts or the second set of contacts by the first set of vias. In some embodiments, the first set of signal lines is electrically coupled to at least the set of gates by the second set of vias.

In operation 916 of method 900, a third conductive material is deposited on the third level thereby forming a second set of power rails and a second set of signal lines. In some embodiments, operation 916 includes at least depositing a second set of conductive regions over the front-side of the integrated circuit.

In some embodiments, the second set of power rails of method 900 includes one or more portions of at least conductors 220b or 220h. In some embodiments, the second set of signal lines of method 900 includes one or more portions of at least conductors 220d or 220f.

In some embodiments, the second set of power rails is electrically coupled to at least the first set of contacts or the second set of contacts by the first set of vias. In some embodiments, the second set of signal lines is electrically coupled to at least the set of gates by the second set of vias.

In some embodiments, operations 914 and 916 are performed by at least two or more M0 masks.

In operation 918 of method 900, a third cut process is performed to remove portions of at least the first set of signal lines or the second set of signal lines. In some embodiments, the removed portions of the first set of signal lines or the second set of signal lines of method 900 includes features similar to at least the removed conductors 222*a* and 222*b*. In some embodiments, the removed portions of the set of gates of method 900 includes features in the M0 level.

In operation 920 of method 900, a third set of vias are formed. In some embodiments, the third set of vias of method 900 are in the V0 level. In some embodiments, the third set of vias of method 900 includes at least the set of vias 224. In some embodiments, the third set of vias are formed over at least the first set of signal lines or the second set of signal lines.

In some embodiments, operation 920 includes forming a first set of self-aligned contacts (SACs) in the insulating layer over the front-side of the wafer. In some embodiments, the third set of vias is electrically coupled to at least the set of transistors.

In operation 922 of method 900, a fourth conductive material is deposited on a fourth level thereby forming a first set of conductors. In some embodiments, the fourth level of method 900 includes the M1 layer. In some embodiments, the first set of conductors of method 900 includes one or more portions of at least the set of conductors 230. In some embodiments, the first set of conductors of method 900 includes one or more conductors similar to at least conductors in the M1 layer.

In some embodiments, one or more of operations 904, 906, 908, 910, 912, 914, 916, 918, 920 or 922 of method 900 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 13:
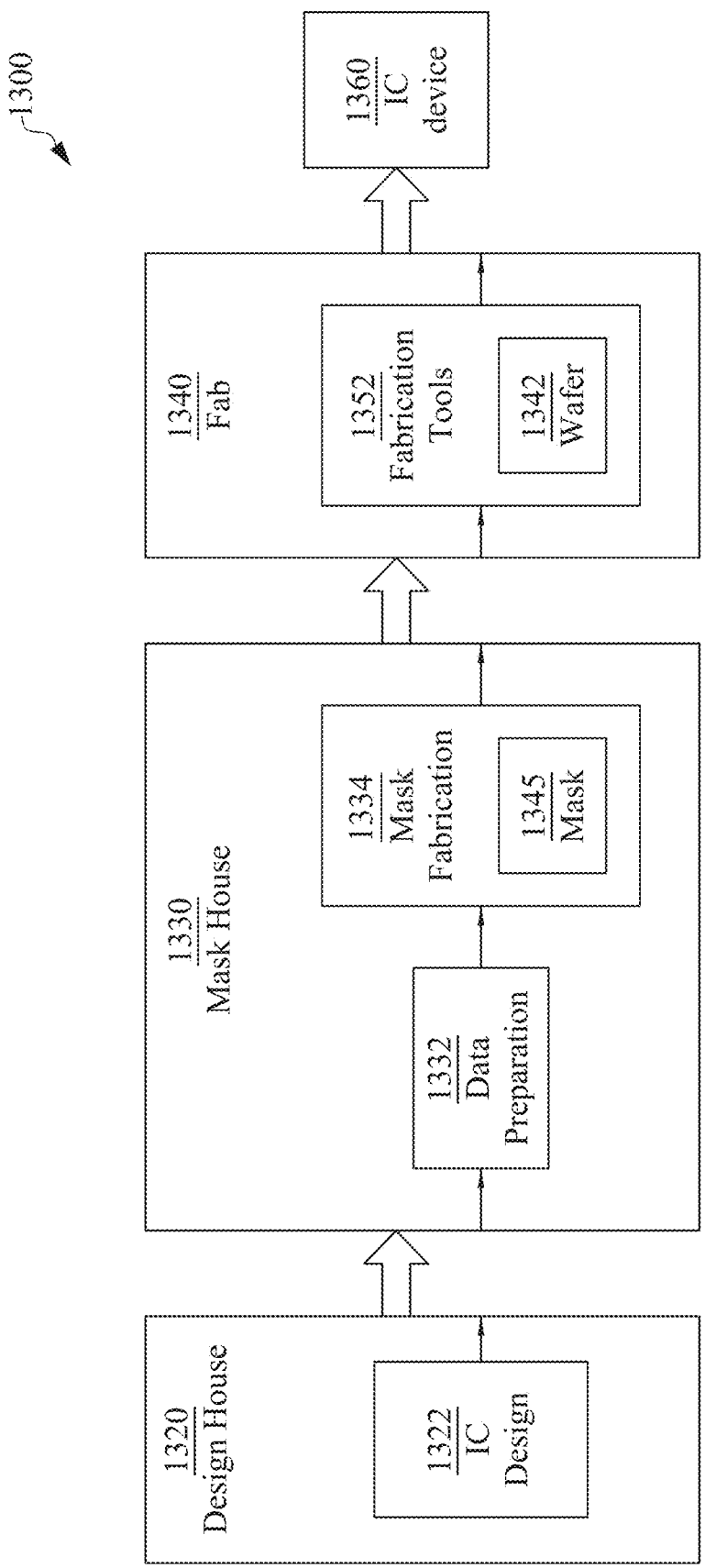
FIG. 13 is a block diagram of an IC manufacturing system, and an IC manufacturing flow associated therewith, in accordance with at least one embodiment of the present disclosure.

In some embodiments, at least one or more operations of method 900 is performed by system 1300 of FIG. 13. In some embodiments, at least one method(s), such as method 900 discussed above, is performed in whole or in part by at least one manufacturing system, including system 1300. One or more of the operations of method 900 is performed by IC fab 1340 (FIG. 13) to fabricate IC device 1360. In some embodiments, one or more of the operations of method 900 is performed by fabrication tools 1352 to fabricate wafer 1342.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 904, 906, 908, 910, 912, 914, 916, 918, 920 or 922, the conductive material is planarized to provide a level surface for subsequent steps.

In some embodiments, one or more of the operations of method 900, 1000 or 1100 is not performed.

One or more of the operations of methods 1000-1100 is performed by a processing device configured to execute instructions for manufacturing an integrated circuit, such as at least integrated circuit 200, 400, 500, 600, 700, or 800. In some embodiments, one or more operations of methods 1000-1100 is performed using a same processing device as that used in a different one or more operations of methods 1000-1100. In some embodiments, a different processing device is used to perform one or more operations of methods 1000-1100 from that used to perform a different one or more operations of methods 1000-1100. In some embodiments, other order of operations of method 900, 1000 or 1100 is within the scope of the present disclosure. Method 900, 1000 or 1100 includes exemplary operations, but the operations are not necessarily performed in the order shown. Operations in method 900, 1000 or 1100 may be added, replaced, changed order, and/or eliminated as appropriate, in accordance with the spirit and scope of disclosed embodiments.

FIG. 10 is a flowchart of a method 1000 of forming or manufacturing an integrated circuit in accordance with some embodiments. It is understood that additional operations may be performed before, during, and/or after the method 1000 depicted in FIG. 10, and that some other operations may only be briefly described herein. In some embodiments, the method 1000 is usable to form integrated circuits, such as at least integrated circuit 200, 400, 500, 600, 700, or 800. In some embodiments, the method 1000 is usable to form integrated circuits having similar features and similar structural relationships as one or more of layout design 100 or 300.

In operation 1002 of method 1000, a layout design of an integrated circuit is generated. Operation 1002 is performed by a processing device (e.g., processor 1202 (FIG. 12)) configured to execute instructions for generating a layout design. In some embodiments, the layout design of method 1000 includes one or more patterns of at least layout design 100 or 300, or one or more features similar to at least integrated circuit 200, 400, 500, 600, 700, or 800. In some embodiments, the layout design of the present application is in a graphic database system (GDSII) file format.

In operation 1004 of method 1000, the integrated circuit is manufactured based on the layout design. In some embodiments, operation 1004 of method 1000 comprises manufacturing at least one mask based on the layout design, and manufacturing the integrated circuit based on the at least one mask. In some embodiments, operation 1004 is an embodiment of method 900.

In operation 1006 of method 1000, a portion of the integrated circuit is removed by one or more cut processes. In some embodiments, operation 1006 is an embodiment of one or more of operations 906, 910 or 918 of method 900.

In some embodiments, operation 1006 comprises removing one or more gate portions from the gate by one or more cut-poly (CPO) processes. In some embodiments, the one or more cut-poly (CPO) processes of operation 1006 includes removing a portion 205 of gate structure 204 thereby forming gate structure 204*a*1, 204*b*1, 204*c*1 and corresponding gate structure 204*a*2, 204*b*2, 204*c*2. In some embodiments, the removed portion 205 of the gate structure 204 corresponds to a poly cut region (e.g., poly cut feature pattern 105).

In some embodiments, the portion 205 of the gate structure 204 that is removed in operation 1006 is identified in layout design 100 by poly cut feature pattern 105. In some embodiments, the poly cut feature pattern 105 identifies a location of the removed portion 205 of the gate structure 204 of integrated circuit 200.

In some embodiments, operation 1006 comprises removing one or more contact portions from the contact by one or more cut-MD (CMD) processes. In some embodiments, the one or more CMD processes of operation 1006 includes removing a portion 208 of contact 206 thereby forming contact 206a1, 206c1, 206d1 and corresponding contact 206a2, 206c2, 206d2. In some embodiments, the removed portion 208 of the contact 206 corresponds to a cut MD region (e.g., cut feature pattern 108).

In some embodiments, the portion 208 of the contact 206 that is removed in operation 1006 is identified in layout design 100 by cut feature pattern 108. In some embodiments, the cut feature pattern 108 identifies a location of the removed contact 208 of the contact 206 of integrated circuit 200.

In some embodiments, operation 1006 comprises removing one or more conductive portions from the conductor by one or more cut-M0 (CM0) processes. In some embodiments, the one or more CM0 processes of operation 1006 includes removing a portion 222a, 222b of corresponding conductors 220d, 220e. In some embodiments, the removed portion 222a, 222b of corresponding conductors 220d, 220e are corresponding cut M0 regions (e.g., cut feature pattern 222).

In some embodiments, the portion 222 of the conductor 220 that is removed in operation 1006 is identified in layout design 100 by cut feature pattern 122. In some embodiments, the cut feature pattern 122 identifies a location of the removed conductor 222 of the conductor 220 of integrated circuit 200.

In some embodiments, operation 1006 is performed by one or more removal processes. In some embodiments, the one or more removal processes include one or more etching processes suitable to remove a portion of gate structure 204, contact 206 or conductor 220. In some embodiments, the etching process of operation 1006 includes identifying a portion of the gate structure 205, contact 208 or conductor 222 that is to be removed, and etching the portion of the gate structure 205, contact 208 or conductor 222 that is to be removed. In some embodiments, a mask is used to specify portions of the gate structure 205, contact 208 or conductor 222 that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like. In some embodiments, operation 1004 or 1006 of method 1000 is useable to manufacture one or more integrated circuits having one or more of the advantages described in FIG. 1A-1D or 2A-2H, and similar detailed description is therefore omitted.

In some embodiments, operation 1006 results in the formation of IC 200, 400, 500, 600, 700 or 800. In some embodiments, operation 1006 is not performed.

Figure 11:
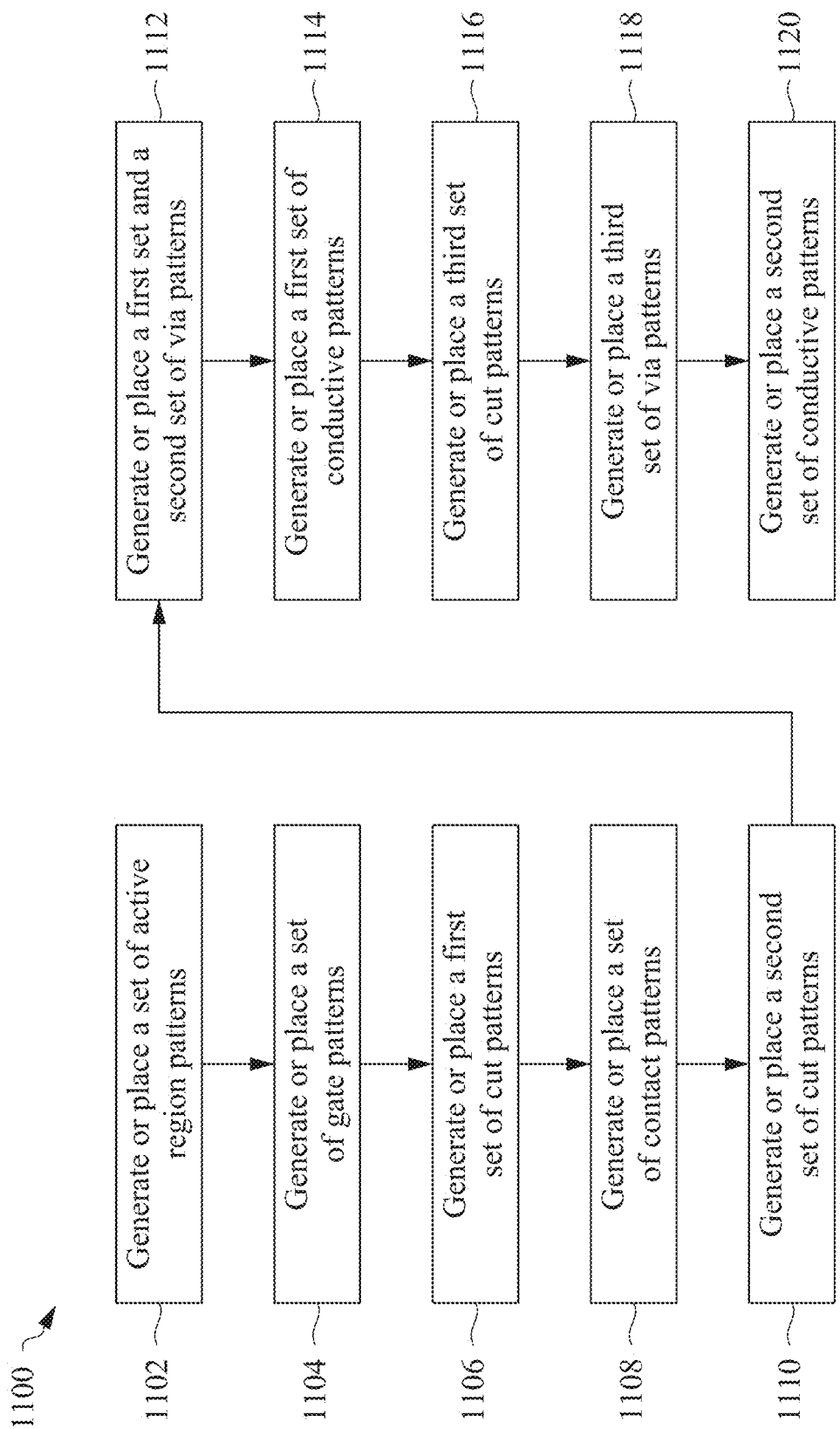
FIG. 11 is a flowchart of a method of generating a layout design of an integrated circuit in accordance with some embodiments.

FIG. 11 is a flowchart of a method 1100 of generating a layout design of an integrated circuit, in accordance with some embodiments. It is understood that additional operations may be performed before, during, and/or after the method 1100 depicted in FIG. 11, and that some other processes may only be briefly described herein. In some embodiments, method 1100 is an embodiment of operation 1002 of method 1000. In some embodiments, method 1100 is usable to generate one or more layout patterns of at least layout design 100 or 300, or one or more features similar to at least integrated circuit 200, 400, 500, 600, 700, or 800.

In some embodiments, method 1100 is usable to generate one or more layout patterns having structural relationships including alignment, lengths and widths, as well as configurations and layers of at least layout design 100 or 300, or one or more features similar to at least integrated circuit 200, 400, 500, 600, 700, or 800, and similar detailed description will not be described in FIG. 11, for brevity.

In operation 1102 of method 1100, a set of active region patterns is generated or placed on the layout design. In some embodiments, the set of active region patterns of method 1100 includes at least portions of one or more patterns of set of active region patterns 102. In some embodiments, the set of active region patterns of method 1100 includes one or more regions similar to the set of active regions 202.

In operation 1104 of method 1100, a set of gate patterns is generated or placed on the layout design. In some embodiments, the set of gate patterns of method 1100 includes at least portions of one or more gate patterns of set of gate patterns 104. In some embodiments, the set of gate patterns of method 1100 includes one or more gate patterns similar to at least the set of gates 204, 404, 504, 604 or 704.

In operation 1106 of method 1100, a first set of cut patterns is generated or placed on the layout design. In some embodiments, the first set of cut patterns of method 1100 includes at least portions of one or more cut patterns of the set of poly cut feature patterns 105.

In some embodiments, the first set of cut patterns of method 1100 includes one or more cut patterns similar to at least gate portions of gate structure 205a, 505a, 505b or 605a that are removed during operation 1006 of method 1000 (FIG. 10).

In operation 1108 of method 1100, a set of contact patterns is generated or placed on the layout design. In some embodiments, the set of contact patterns of method 1100 includes at least portions of one or more patterns of at least the set of contact patterns 106. In some embodiments, the set of contact patterns of method 1100 includes one or more contact patterns similar to at least the set of contact 206 or 406.

In operation 1110 of method 1100, a second set of cut patterns is generated or placed on the layout design. In some embodiments, the second set of cut patterns of method 1100 includes at least portions of one or more cut patterns of the set of contact cut feature patterns 108.

In some embodiments, the second set of cut patterns of method 1100 includes one or more cut patterns similar to at least contact portions of contacts 208a, 208b or 408b that are removed during operation 1006 of method 1000 (FIG. 10).

In operation 1112 of method 1100, a first set of via patterns and a second set of via patterns are generated or placed on the layout design. In some embodiments, the first set of via patterns of method 1100 includes at least portions of one or more patterns of set of via patterns 110. In some embodiments, the first set of via patterns of method 1100 includes one or more via patterns similar to at least the set of vias 210, 410, 510 or 610. In some embodiments, the first set of via patterns of method 1100 includes one or more vias similar to at least vias in the VD layer.

In some embodiments, the second set of via patterns of method 1100 includes at least portions of one or more patterns of set of via patterns 112. In some embodiments, the second set of via patterns of method 1100 includes one or more via patterns similar to at least the set of vias 212, 412, 512, 612, 712 or 812. In some embodiments, the second set of via patterns of method 1100 includes one or more vias similar to at least vias in the VG layer.

In operation 1114 of method 1100, a first set of conductive patterns is generated or placed on the layout design. In some embodiments, the first set of conductive patterns of method 1100 includes at least portions of one or more conductive feature patterns of at least the set of conductive feature patterns 120. In some embodiments, the first set of conductive patterns of method 1100 includes one or more conductive feature patterns similar to at least the set of conductors 220. In some embodiments, the first set of conductive patterns of method 1100 includes one or more conductors similar to at least conductors in the M0 layer.

In operation 1116 of method 1100, a third set of cut patterns is generated or placed on the layout design. In some embodiments, the third set of cut patterns of method 1100 includes at least portions of one or more cut patterns of the set of conductive feature patterns 120.

In some embodiments, the third set of cut patterns of method 1100 includes one or more cut patterns similar to at least portions of conductors 222a and 222b that are removed during operation 1006 of method 1000 (FIG. 10).

In operation 1118 of method 1100, a third set of via patterns is generated or placed on the layout design. In some embodiments, the third set of via patterns of method 1100 includes at least portions of one or more patterns of set of via patterns 124. In some embodiments, the third set of via patterns of method 1100 includes one or more via patterns similar to at least the set of vias 224. In some embodiments, the third set of via patterns of method 1100 includes one or more vias similar to at least vias in the V0 layer.

In operation 1120 of method 1100, a second set of conductive patterns is generated or placed on the layout design. In some embodiments, the second set of conductive patterns of method 1100 includes at least portions of one or more conductive feature patterns of at least the set of conductive feature patterns 130. In some embodiments, the second set of conductive patterns of method 1100 includes one or more conductive feature patterns similar to at least the set of conductors 230. In some embodiments, the second set of conductive patterns of method 1100 includes one or more conductors similar to at least conductors in the M1 layer.

Figure 12:
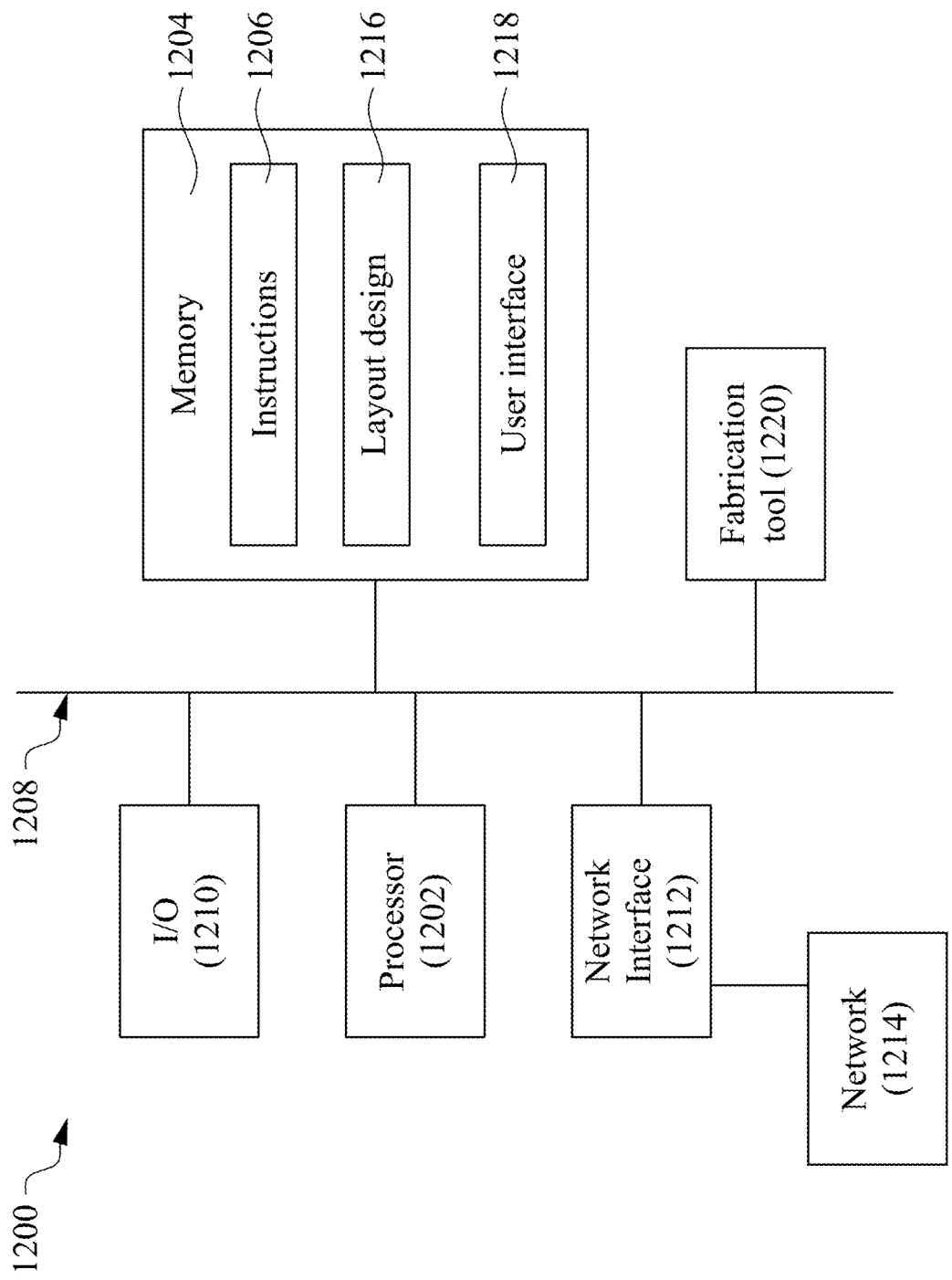
FIG. 12 is a schematic view of a system for designing an IC layout design and manufacturing an IC circuit in accordance with some embodiments.

FIG. 12 is a schematic view of a system 1200 for designing an IC layout design and manufacturing an IC circuit in accordance with some embodiments.

In some embodiments, system 1200 generates or places one or more IC layout designs described herein. System 1200 includes a hardware processor 1202 and a non-transitory, computer readable storage medium 1204 (e.g., memory 1204) encoded with, i.e., storing, the computer program code 1206, i.e., a set of executable instructions 1206. Computer readable storage medium 1204 is configured for interfacing with manufacturing machines for producing the integrated circuit. The processor 1202 is electrically coupled to the computer readable storage medium 1204 via a bus 1208. The processor 1202 is also electrically coupled to an I/O interface 1210 by bus 1208. A network interface 1212 is also electrically connected to the processor 1202 via bus 1208. Network interface 1212 is connected to a network 1214, so that processor 1202 and computer readable storage medium 1204 are capable of connecting to external elements via network 1214. The processor 1202 is configured to execute the computer program code 1206 encoded in the computer readable storage medium 1204 in order to cause system 1200 to be usable for performing a portion or all of the operations as described in method 1000-1100.

In some embodiments, the processor 1202 is a central processing unit (CPU), a multi-processor, a distributed processing system, an application specific integrated circuit (ASIC), and/or a suitable processing unit.

In some embodiments, the computer readable storage medium 1204 is an electronic, magnetic, optical, electromagnetic, infrared, and/or a semiconductor system (or apparatus or device). For example, the computer readable storage medium 1204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1204 includes a compact disk-read only memory (CD-ROM), a compact disk-read/write (CD-R/W), and/or a digital video disc (DVD).

In some embodiments, the storage medium 1204 stores the computer program code 1206 configured to cause system 1200 to perform method 1000-1100. In some embodiments, the storage medium 1204 also stores information needed for performing method 1000-1100 as well as information generated during performing method 1000-1100, such as layout design 1216, user interface 1218 and fabrication tool 1220, and/or a set of executable instructions to perform the operation of method 1000-1100. In some embodiments, layout design 1216 comprises one or more of layout patterns of at least layout design 100 or 300, or features similar to at least integrated circuit 200, 400, 500, 600, 700, or 800.

In some embodiments, the storage medium 1204 stores instructions (e.g., computer program code 1206) for interfacing with manufacturing machines. The instructions (e.g., computer program code 1206) enable processor 1202 to generate manufacturing instructions readable by the manufacturing machines to effectively implement method 1000-1100 during a manufacturing process.

System 1200 includes I/O interface 1210. I/O interface 1210 is coupled to external circuitry. In some embodiments, I/O interface 1210 includes a keyboard, keypad, mouse, trackball, trackpad, and/or cursor direction keys for communicating information and commands to processor 1202.

System 1200 also includes network interface 1212 coupled to the processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interface such as ETHERNET, USB, or IEEE-2094. In some embodiments, method 1000-1100 is implemented in two or more systems 1200, and information such as layout design, and user interface are exchanged between different systems 1200 by network 1214.

System 1200 is configured to receive information related to a layout design through I/O interface 1210 or network interface 1212. The information is transferred to processor 1202 by bus 1208 to determine a layout design for producing at least integrated circuit 200, 400, 500, 600, 700, or 800. The layout design is then stored in computer readable medium 1204 as layout design 1216. System 1200 is configured to receive information related to a user interface through I/O interface 1210 or network interface 1212. The information is stored in computer readable medium 1204 as user interface 1218. System 1200 is configured to receive information related to a fabrication tool 1220 through I/O interface 1210 or network interface 1212. The information is stored in computer readable medium 1204 as fabrication tool 1220. In some embodiments, the fabrication tool 1220 includes fabrication information utilized by system 1200. In some embodiments, the fabrication tool 1220 corresponds to mask fabrication 1334 of FIG. 13.

In some embodiments, method 1000-1100 is implemented as a standalone software application for execution by a processor. In some embodiments, method 1000-1100 is implemented as a software application that is a part of an additional software application. In some embodiments, method 1000-1100 is implemented as a plug-in to a software application. In some embodiments, method 1000-1100 is implemented as a software application that is a portion of an EDA tool. In some embodiments, method 1000-1100 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1000-1100 is implemented by a manufacturing device to manufacture an integrated circuit using a set of masks manufactured based on one or more layout designs generated by system 1200. In some embodiments, system 1200 is a manufacturing device configured to manufacture an integrated circuit using a set of masks manufactured based on one or more layout designs of the present disclosure. In some embodiments, system 1200 of FIG. 12 generates layout designs of an integrated circuit that are smaller than other approaches. In some embodiments, system 1200 of FIG. 12 generates layout designs of integrated circuit structure that occupy less area and provide better routing resources than other approaches.

FIG. 13 is a block diagram of an integrated circuit (IC) manufacturing system 1300, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 (hereinafter "system 1300") includes entities, such as a design house 1320, a mask house 1330, and an IC manufacturer/fabricator ("fab") 1340, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1320, mask house 1330, and IC fab 1340 is owned by a single larger company. In some embodiments, one or more of design house 1320, mask house 1330, and IC fab 1340 coexist in a common facility and use common resources.

Design house (or design team) 1320 generates an IC design layout 1322. IC design layout 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout 1322 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout 1322. The design procedure includes one or more of logic design, physical design or place and route. IC design layout 1322 is presented in one or more data files having information of the geometrical patterns. For example, IC design layout 1322 can be expressed in a GDSII file format or DFII file format.

Mask house 1330 includes data preparation 1332 and mask fabrication 1334. Mask house 1330 uses IC design layout 1322 to manufacture one or more masks 1345 to be used for fabricating the various layers of IC device 1360 according to IC design layout 1322. Mask house 1330 performs mask data preparation 1332, where IC design layout 1322 is translated into a representative data file (RDF). Mask data preparation 1332 provides the RDF to mask fabrication 1334. Mask fabrication 1334 includes a mask writer. A mask writer converts the RDF to an image on a substrate, such as a mask (reticle) 1345 or a semiconductor wafer 1342. The design layout 1322 is manipulated by mask data preparation 1332 to comply with particular characteristics of the mask writer and/or requirements of IC fab 1340. In FIG. 13, mask data preparation 1332 and mask fabrication 1334 are illustrated as separate elements. In some embodiments, mask data preparation 1332 and mask fabrication 1334 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1334, which may undo part of the modifications performed by OPC in order to meet mask creation rules.

In some embodiments, mask data preparation 1332 includes lithography process checking (LPC) that simulates processing that will be implemented by IC fab 1340 to fabricate IC device 1360. LPC simulates this processing based on IC design layout 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1322.

It should be understood that the above description of mask data preparation 1332 has been simplified for the purposes of clarity. In some embodiments, data preparation 1332 includes additional features such as a logic operation (LOP) to modify the IC design layout according to manufacturing rules. Additionally, the processes applied to IC design layout 1322 during data preparation 1332 may be executed in a variety of different orders.

After mask data preparation 1332 and during mask fabrication 1334, a mask 1345 or a group of masks 1345 are fabricated based on the modified IC design layout 1322. In some embodiments, mask fabrication 1334 includes performing one or more lithographic exposures based on IC design 1322. In some embodiments, an electron-beam (e-beam) or a mechanism of multiple e-beams is used to form a pattern on a mask (photomask or reticle) 1345 based on the modified IC design layout 1322. The mask 1345 can be formed in various technologies. In some embodiments, the mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1345 includes a transparent substrate (e.g., fused quartz) and an opaque material (e.g., chromium) coated in the opaque regions of the binary mask. In another example, the mask 1345 is formed using a phase shift technology. In the phase shift mask (PSM) version of mask 1345, various features in the pattern formed on the mask are configured to have proper phase difference to enhance the resolution and imaging quality. In various examples, the phase shift mask can be attenuated PSM or alternating PSM. The mask(s) generated by mask fabrication 1334 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1340 is an IC fabrication entity that includes one or more manufacturing facilities for the fabrication of a variety of different IC products. In some embodiments, IC Fab 1340 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1340 includes wafer fabrication tools 1352 (hereinafter "fabrication tools 1352") configured to execute various manufacturing operations on semiconductor wafer 1342 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1340 uses mask(s) 1345 fabricated by mask house 1330 to fabricate IC device 1360. Thus, IC fab 1340 at least indirectly uses IC design layout 1322 to fabricate IC device 1360. In some embodiments, a semiconductor wafer 1342 is fabricated by IC fab 1340 using mask(s) 1345 to form IC device 1360. In some embodiments, the IC fabrication includes performing one or more lithographic exposures based at least indirectly on IC design 1322. Semiconductor wafer 1342 includes a silicon substrate or other proper substrate having material layers formed thereon. Semiconductor wafer 1342 further includes one or more of various doped regions, dielectric features, multilevel interconnects, and the like (formed at subsequent manufacturing steps).

System 1300 is shown as having design house 1320, mask house 1330 or IC fab 1340 as separate components or entities. However, it is understood that one or more of design house 1320, mask house 1330 or IC fab 1340 are part of the same component or entity.

Details regarding an integrated circuit (IC) manufacturing system (e.g., system 1300 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a set of active regions that extend in a first direction, and is on a first level of a substrate. In some embodiments, the integrated circuit further includes a first set of contacts that extend in a second direction different from the first direction, is on a second level different from the first level, and overlaps the set of active regions, the first set of contacts overlaps a first cell boundary and a second cell boundary of the integrated circuit that extends in the second direction. In some embodiments, the integrated circuit further includes a set of gates that extend in the second direction, is on a third level different from the first level, the set of gates overlaps the set of active regions, and is between the first cell boundary and the second cell boundary. In some embodiments, the integrated circuit further includes a first set of power rails that extend in the first direction, configured to supply a first supply voltage or a second supply voltage, and is on a fourth level different from the first level, the second level and the third level, the first set of power rails overlaps at least the first set of contacts. In some embodiments, the integrated circuit further includes a first set of vias between the first set of contacts and the first set of power rails. In some embodiments, the first set of vias electrically couples the first set of contacts and the first set of power rails together. In some embodiments, the set of active regions extends continuously through the first cell boundary and the second cell boundary.

Another aspect of this description relates to an integrated circuit. In some embodiments, the integrated circuit includes a first active region, a second active region, a first set of contacts, a second set of contacts, a set of gates, a first power rail and a first set of vias. In some embodiments, the first active region extends in a first direction, and is on a first level of a substrate. In some embodiments, the first active region corresponds to a first set of transistors of a first dopant type. In some embodiments, the second active region extends in the first direction, is on the first level, and is separated from the first active region in a second direction different from the first direction. In some embodiments, the second active region corresponds to a second set of transistors of a second dopant type different from the first dopant type. In some embodiments, the first set of contacts extends in the second direction, is on a second level different from the first level. In some embodiments, the first set of contacts overlaps the first active region, a first cell boundary and a second cell boundary of the integrated circuit that extends in the second direction. In some embodiments, the second set of contacts extends in the second direction, is on the second level, overlaps the second active region, the first cell boundary and the second cell boundary, and is separated from the first set of contacts in the second direction. In some embodiments, the set of gates extends in the second direction, is on a third level different from the first level. In some embodiments, the set of gates overlaps the first active region and the second active region, and does not overlap the first cell boundary and the second cell boundary. In some embodiments, the first power rail extends in the first direction, is configured to supply a first supply voltage, and is on a fourth level different from the first level, the second level and the third level. In some embodiments, the first power rail overlaps at least the first set of contacts. In some embodiments, the first set of vias is between the first set of contacts and the first power rail. In some embodiments, the first set of vias electrically couples the first set of contacts and the first power rail together. In some embodiments, the first active region and the second active region extend continuously through the first cell boundary and the second cell boundary. In some embodiments, the first set of transistors includes a first transistor configured as a capacitor.

Still another aspect of this description relates to a method of fabricating an integrated circuit. In some embodiments, the method includes fabricating a set of active regions of a set of transistors in a front-side of a substrate, the set of active regions extending in a first direction; depositing a first conductive material over the set of active regions on a first level thereby forming a first set of contacts and a second set of contacts for the set of transistors, the first set of contacts overlapping a first cell boundary and a second cell boundary, the second set of contacts being between the first set of contacts, the first and second set of contacts extending in a second direction different from the first direction; fabricating a set of gates over the set of active regions on a second level, the set of gates extending in the second direction, the set of gates overlapping the set of active regions, and being between the first set of contacts; and not overlapping the first cell boundary and the second cell boundary; fabricating a first set of vias over the first set of contacts; and depositing a second conductive material over at least the first set of contacts and the second set of contacts on a third level thereby forming a first set of power rails and a first set of signal lines, the third level being above the first level and the second level, the first set of power rails being electrically coupled to at least the first set of contacts or the second set of contacts by the first set of vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a set of active regions extending in a first direction, and being on a first level of a substrate;
   a first set of contacts extending in a second direction different from the first direction, being on a second level different from the first level, and overlapping the set of active regions, the first set of contacts overlapping a first cell boundary and a second cell boundary of the integrated circuit that extends in the second direction;
   a set of gates extending in the second direction, being on a third level different from the first level, the set of gates overlapping the set of active regions, and being between the first cell boundary and the second cell boundary;
   a first set of power rails extending in the first direction, configured to supply a first supply voltage or a second supply voltage, and being on a fourth level different from the first level, the second level and the third level, the first set of power rails overlapping at least the first set of contacts; and
   a first set of vias between the first set of contacts and the first set of power rails, the first set of vias electrically coupling the first set of contacts and the first set of power rails together,
   wherein the set of active regions extend continuously through the first cell boundary and the second cell boundary.

2. The integrated circuit of claim 1, further comprising:
   a second set of power rails extending in the first direction, configured to supply the first supply voltage or the second supply voltage, and being on the fourth level, and overlapping at least the set of gates.

3. The integrated circuit of claim 2, further comprising:
   a second set of vias between the set of gates and the second set of power rails, the second set of vias electrically coupling the set of gates and the second set of power rails together.

4. The integrated circuit of claim 3, wherein
   each power rail of the first set of power rails has a first width in the second direction; and
   each power rail of the second set of power rails has a second width in the second direction different from the first width.

5. The integrated circuit of claim 1, further comprising:
   a second set of contacts extending in the second direction, being on the second level, and overlapping the set of active regions, and being between a pair of contacts of the first set of contacts.

6. The integrated circuit of claim 5, further comprising:
   a first set of conductors extending in the first direction, being on the fourth level, and overlapping the set of active regions.

7. The integrated circuit of claim 6, further comprising:
   a second set of vias between the second set of contacts and the first set of conductors, the second set of vias electrically coupling the second set of contacts and the first set of conductors together.

8. The integrated circuit of claim 5, further comprising:
   a first set of conductors extending in the first direction, being on the fourth level, and overlapping the set of gates.

9. The integrated circuit of claim 8, further comprising:
   a second set of vias between the set of gates and the first set of conductors, the second set of vias electrically coupling the set of gates and the first set of conductors together.

10. An integrated circuit comprising:
a first active region extending in a first direction, and being on a first level of a substrate, the first active region corresponding to a first set of transistors of a first dopant type;
a second active region extending in the first direction, being on the first level, and being separated from the first active region in a second direction different from the first direction, the second active region corresponding to a second set of transistors of a second dopant type different from the first dopant type;
a first set of contacts extending in the second direction, being on a second level different from the first level, the first set of contacts overlapping the first active region, a first cell boundary and a second cell boundary of the integrated circuit that extends in the second direction;
a second set of contacts extending in the second direction, being on the second level, overlapping the second active region, the first cell boundary and the second cell boundary, and being separated from the first set of contacts in the second direction;
a set of gates extending in the second direction, being on a third level different from the first level, the set of gates overlapping the first active region and the second active region, and not overlapping the first cell boundary and the second cell boundary;
a first power rail extending in the first direction, configured to supply a first supply voltage, and being on a fourth level different from the first level, the second level and the third level, the first power rail overlapping at least the first set of contacts; and
a first set of vias between the first set of contacts and the first power rail, the first set of vias electrically coupling the first set of contacts and the first power rail together;
wherein the first active region and the second active region extend continuously through the first cell boundary and the second cell boundary, and
wherein the first set of transistors includes a first transistor configured as a capacitor.

11. The integrated circuit of claim 10, further comprising:
a second power rail extending in the first direction, configured to supply a second supply voltage, and being on the fourth level, and overlapping at least the second set of contacts; and
a second set of vias between the second set of contacts and the second power rail, the second set of vias electrically coupling the second set of contacts and the second power rail together.

12. The integrated circuit of claim 11, further comprising:
a third power rail extending in the first direction, configured to supply the second supply voltage, and being on the fourth level, and overlapping at least the set of gates; and
a third set of vias between the set of gates and the third power rail, the third set of vias electrically coupling the set of gates and the third power rail together.

13. The integrated circuit of claim 12, wherein
the first set of contacts includes a first contact overlapping the first cell boundary and a second contact overlapping the second cell boundary;
the second set of contacts includes a third contact overlapping the first cell boundary and a fourth contact overlapping the second cell boundary; and
the set of gates includes a first gate structure overlapping the first active region and the second active region.

14. The integrated circuit of claim 13, further comprising:
a fifth contact extending in the second direction, being on the second level, overlapping the first active region, and being between the first contact and the second contact;
a sixth contact extending in the second direction, being on the second level, overlapping the second active region, and being between the third contact and the fourth contact, the sixth contact being separated from the fifth contact in the second direction; and
a seventh contact extending in the second direction, being on the second level, overlapping the first active region and the second active region, and being between at least the fifth contact and the second contact, the second contact being separated from the fifth contact and the sixth contact in the second direction.

15. The integrated circuit of claim 14, wherein the capacitor includes:
a first source of the first transistor coupled to the first power rail;
a first drain of the first transistor coupled to the first power rail; and
a first gate of the first transistor coupled to the second power rail.

16. The integrated circuit of claim 15, wherein
the first set of vias includes a first via and a second via;
the third set of vias includes a third via;
the first active region includes the first source of the first transistor, and the first drain of the first transistor;
the first contact is electrically coupled to the first source of the first transistor;
the fifth contact is electrically coupled to the first drain of the first transistor;
the first via is between the first contact and the first power rail, and the first via electrically couples the first contact and the first power rail together;
the second via is between the fifth contact and the first power rail, and the second via electrically couples the fifth contact and the first power rail together;
the first gate structure includes a first portion that corresponds to the first gate of the first transistor; and
the third via is between the first gate structure and the third power rail, and the third via electrically couples the first gate structure and the second power rail together.

17. The integrated circuit of claim 16, wherein the second set of transistors includes a dummy transistor, the dummy transistor including:
a second source of the dummy transistor coupled to the second power rail;
a second drain of the dummy transistor coupled to the second power rail; and
a second gate of the dummy transistor coupled to the second power rail.

18. The integrated circuit of claim 17, wherein
the second set of vias includes a fourth via and a fifth via;
the second active region includes the second source of the dummy transistor, and the second drain of the dummy transistor;
the third contact is electrically coupled to the second source of the dummy transistor;
the sixth contact is electrically coupled to the second drain of the dummy transistor;
the fourth via is between the third contact and the second power rail, and the fourth via electrically couples the third contact and the second power rail together;
the fifth via is between the sixth contact and the second power rail, and the fifth via electrically couples the sixth contact and the second power rail together; and the first gate structure further includes a second portion that corresponds to the second gate of the dummy transistor.

19. A method of fabricating an integrated circuit, the method comprising:

fabricating a set of active regions of a set of transistors in a front-side of a substrate, the set of active regions extending in a first direction;

depositing a first conductive material over the set of active regions on a first level thereby forming a first set of contacts and a second set of contacts for the set of transistors, the first set of contacts overlapping a first cell boundary and a second cell boundary, the second set of contacts being between the first set of contacts, the first and second set of contacts extending in a second direction different from the first direction;

fabricating a set of gates over the set of active regions on a second level, the set of gates extending in the second direction, the set of gates overlapping the set of active regions, and being between the first set of contacts; and not overlapping the first cell boundary and the second cell boundary;

fabricating a first set of vias over the first set of contacts; and depositing a second conductive material over at least the first set of contacts and the second set of contacts on a third level thereby forming a first set of power rails and a first set of signal lines, the third level being above the first level and the second level, the first set of power rails being electrically coupled to at least the first set of contacts or the second set of contacts by the first set of vias.

20. The method of claim 19, further comprising:

performing a first cut process to remove portions of the first set of contacts and the second set of contacts;

performing a second cut process to remove portions of the set of gates;

fabricating a second set of vias over the set of gates; and depositing a third conductive material over at least the first set of contacts and the second set of contacts on the third level thereby forming a second set of power rails and a second set of signal lines, the second set of power rails being electrically coupled to at least the first set of contacts or the second set of contacts by the first set of vias, and the second set of signal lines being electrically coupled to at least the set of gates by the second set of vias.

* * * * *